(12) United States Patent
Takahashi et al.

(10) Patent No.: US 10,096,613 B2
(45) Date of Patent: Oct. 9, 2018

(54) SEMICONDUCTOR DEVICE AND METHOD FOR MANUFACTURING SAME

(71) Applicant: Toshiba Memory Corporation, Tokyo (JP)

(72) Inventors: Atsushi Takahashi, Mie (JP); Yasuhito Yoshimizu, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 146 days.

(21) Appl. No.: 15/258,559

(22) Filed: Sep. 7, 2016

(65) Prior Publication Data

US 2017/0301687 A1 Oct. 19, 2017

Related U.S. Application Data

(60) Provisional application No. 62/321,963, filed on Apr. 13, 2016.

(51) Int. Cl.

| | | |
|---|---|---|
| *H01L 27/11582* | (2017.01) | |
| *H01L 27/11565* | (2017.01) | |
| *H01L 27/1157* | (2017.01) | |
| *H01L 27/11575* | (2017.01) | |

(52) U.S. Cl.
CPC .... *H01L 27/11582* (2013.01); *H01L 27/1157* (2013.01); *H01L 27/11565* (2013.01); *H01L 27/11575* (2013.01)

(58) Field of Classification Search
CPC ...................... H01L 27/11582; H01L 27/11565
See application file for complete search history.

(56) References Cited

U.S. PATENT DOCUMENTS

| | | |
|---|---|---|
| 7,855,457 B2 | 12/2010 | Mizukami et al. |
| 8,492,824 B2 | 7/2013 | Yahashi |
| 8,541,831 B2 | 9/2013 | Chae et al. |
| 2007/0252201 A1 | 11/2007 | Kito et al. |
| 2011/0057251 A1 | 3/2011 | Higashi |
| 2011/0284947 A1 | 11/2011 | Kito et al. |
| 2011/0287597 A1 | 11/2011 | Kito et al. |
| 2012/0135583 A1 | 5/2012 | Jang et al. |
| 2015/0091075 A1 | 4/2015 | Nishitani et al. |
| 2015/0115455 A1* | 4/2015 | Chen ................ H01L 21/76895 257/773 |
| 2015/0372006 A1 | 12/2015 | Kito et al. |
| 2016/0322381 A1* | 11/2016 | Liu .................. H01L 27/11573 |

\* cited by examiner

*Primary Examiner* — Marc Armand
(74) *Attorney, Agent, or Firm* — Finnegan, Henderson, Farabow, Garrett & Dunner, L.L.P.

(57) ABSTRACT

According to one embodiment, columnar portions extend through an insulating layer and through a stacked body under the insulating layer. The columnar portions are of an insulating material different from the insulating layer. Contact portions include a first contact portion disposed inside a first terrace portion and a second contact portion disposed inside a second terrace portion. The columnar portions including a first columnar portion disposed inside the first terrace portion and a second columnar portion disposed inside the second terrace portion. A shortest distance between the first contact portion and the first columnar portion, and a shortest distance between the second contact portion and the second columnar portion are substantially equal to each other.

10 Claims, 38 Drawing Sheets

US 10,096,613 B2

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/321,963, filed on Apr. 13, 2016; the entire contents of which are incorporated herein by reference.

FIELD

Embodiments described herein relate generally to a semiconductor device and a method for manufacturing a semiconductor device.

BACKGROUND

To connect multiple electrode layers of a three-dimensional memory device to a control circuit, a stairstep-shaped contact structure of the multiple electrode layers has been proposed. Also, a method for the three-dimensional memory device has been proposed in which a stacked body including multiple sacrificial layers is formed; and subsequently, gaps are formed by removing the sacrificial layers. The stacked body including the gaps is supported by columnar portions formed in the stacked body prior to removing the sacrificial layers.

DETAILED DESCRIPTION

According to one embodiment, a semiconductor device includes a foundation layer, a stacked body, a semiconductor body, a charge storage portion, an insulating layer, a plurality of columnar portions, and a plurality of contact portions. The stacked body is provided above the foundation layer. The stacked body includes a plurality of electrode layers stacked with an insulator interposed. The electrode layers have a plurality of terrace portions arranged in a stairstep configuration with a difference in levels. The semiconductor body extends through the stacked body in a stacking direction of the stacked body. The charge storage portion is provided between the semiconductor body and one of the electrode layers. The insulating layer is provided above the terrace portions. The columnar portions extend in the stacking direction through the insulating layer and through the stacked body under the insulating layer. The columnar portions are of an insulating material different from the insulating layer. The contact portions extend in the stacking direction through the insulating layer and are connected to the terrace portions. The contact portions include a first contact portion disposed inside a first terrace portion and a second contact portion disposed inside a second terrace portion. The columnar portions include a first columnar portion disposed inside the first terrace portion and a second columnar portion disposed inside the second terrace portion. A shortest distance between the first contact portion and the first columnar portion, and a shortest distance between the second contact portion and the second columnar portion are substantially equal to each other.

For example, a semiconductor memory device having a memory cell array having a three-dimensional structure is described as a semiconductor device in an embodiment.

Figure 1:
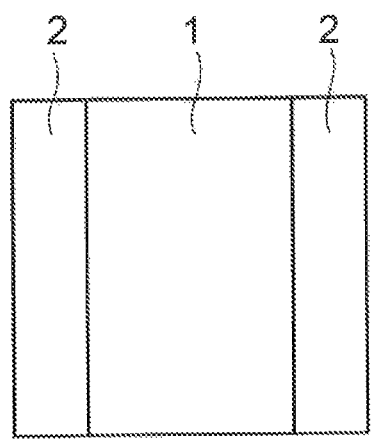
FIG. 1 is a schematic block plan view of a semiconductor device of an embodiment.
Figure 1:
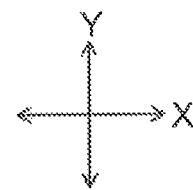

FIG. 1 is a schematic block plan view of the semiconductor device of the embodiment.

Figure 2:
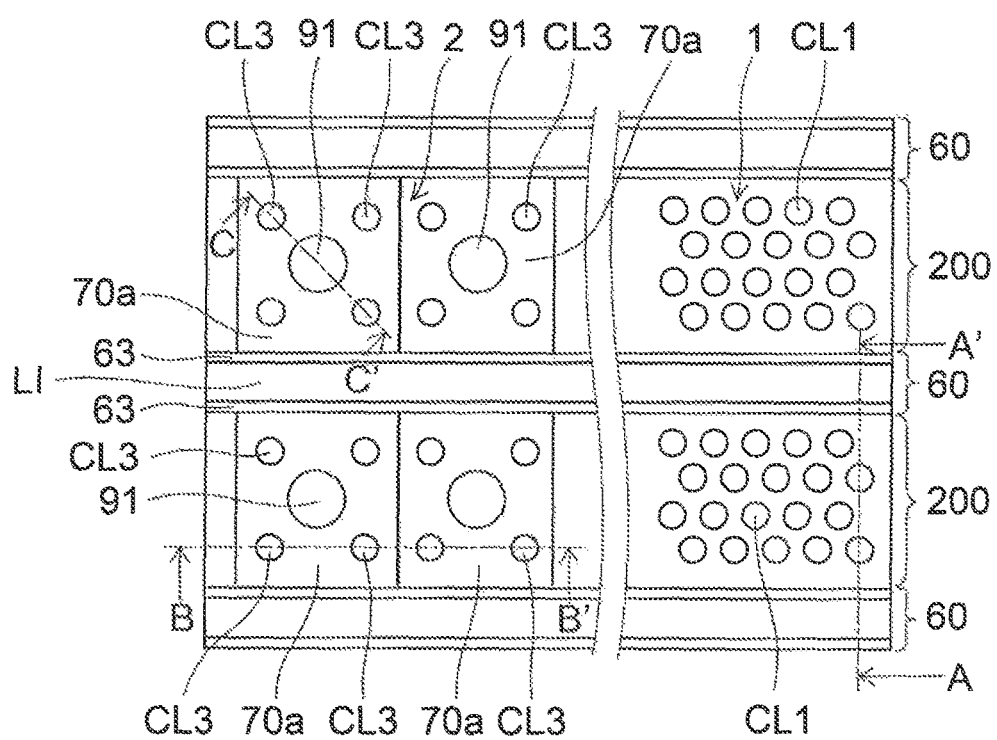
FIG. 2 is a schematic plan view of the semiconductor device of the embodiment.
Figure 2:
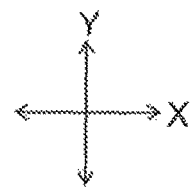

FIG. 2 is a schematic plan view of the semiconductor device of the embodiment.

The semiconductor device of the embodiment includes a memory cell array 1, and a stairstep portion 2 that is provided in a peripheral region outside the memory cell array 1. The memory cell array 1 and the stairstep portion 2 are provided on the same substrate.

Figure 3:
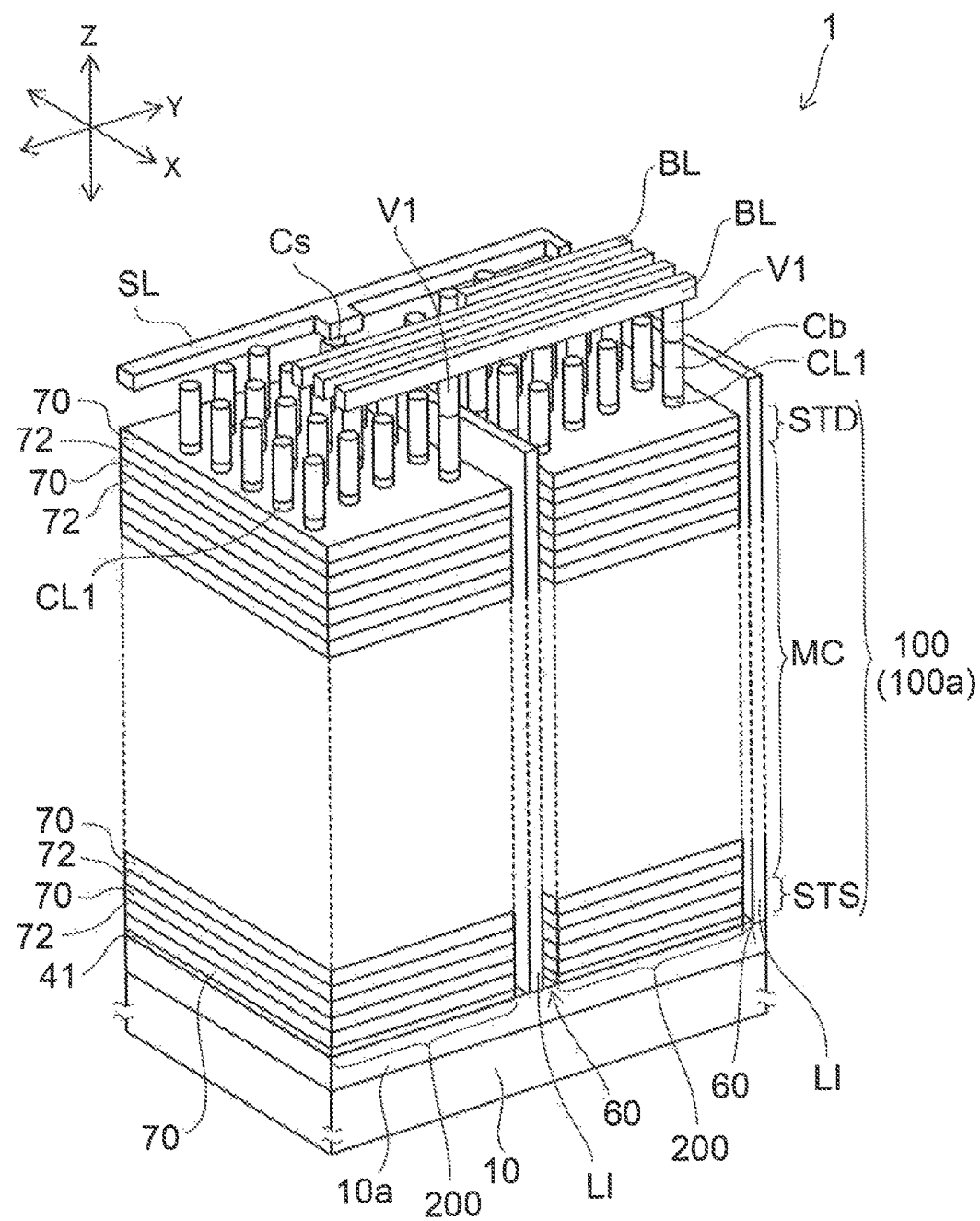
FIG. 3 is a schematic perspective view of a memory cell array of the semiconductor device of the embodiment.

FIG. 3 is a schematic perspective view of the memory cell array 1 of the embodiment.

Figure 4:
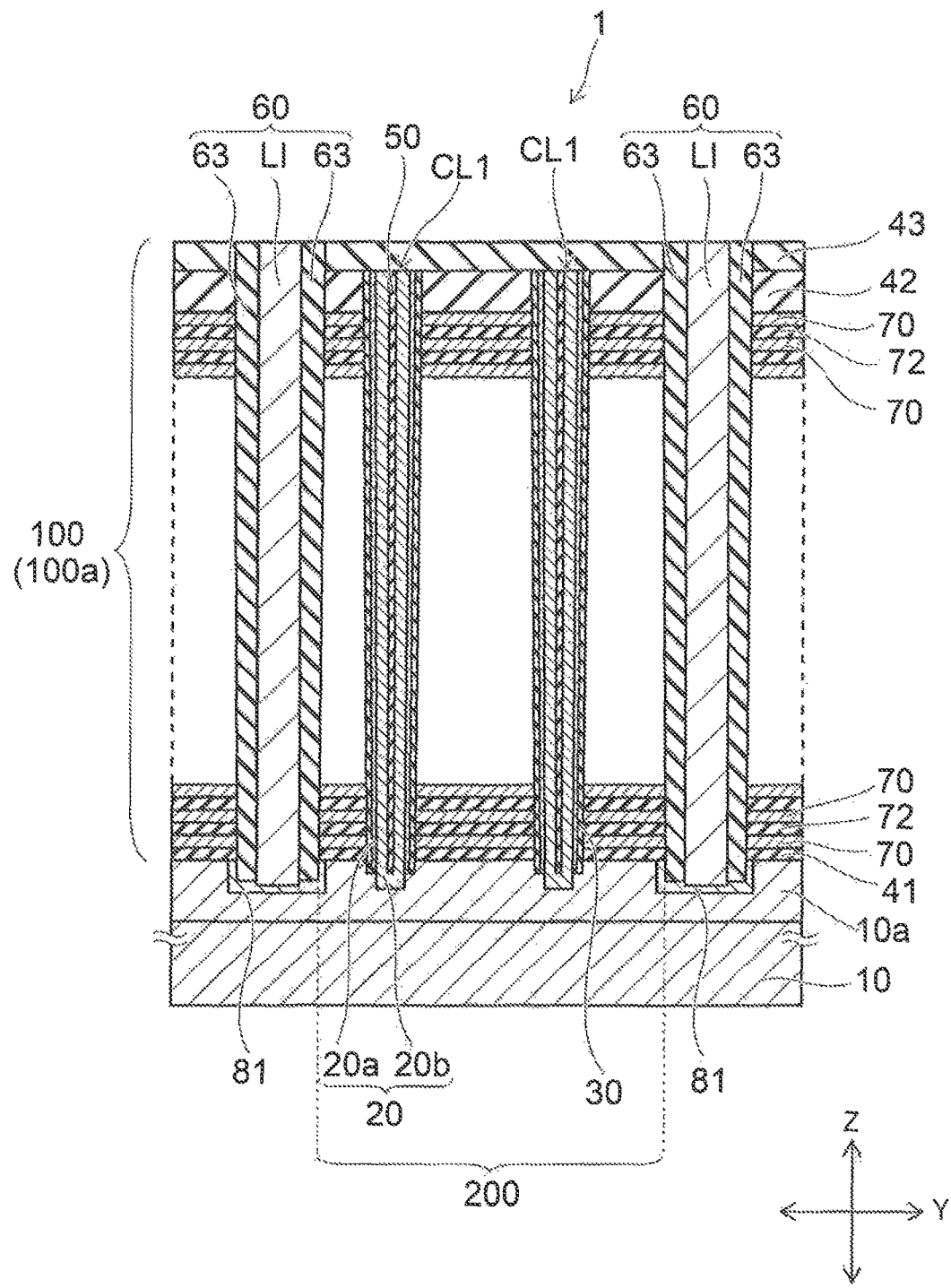
FIG. 4 is an A-A' cross-sectional view of FIG. 2.

FIG. 4 is an A-A' cross-sectional view of FIG. 2.

In FIG. 3, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 3.

The memory cell array 1 includes a substrate 10, a stacked body 100 provided on the substrate 10, multiple columnar portions CL1, multiple separation portions 60, and upper layer interconnects provided above the stacked body 100. For example, bit lines BL and a source line SL are shown as the upper layer interconnects in FIG. 3.

The substrate 10 and the stacked body 100 are provided in a cell array region where the memory cell array 1 is provided, and in a stairstep region where the stairstep portion 2 is provided. The portion of the stacked body 100 provided in the cell array region is taken as a first stacked portion 100a; and the portion of the stacked body 100 provided in the stairstep region is taken as a second stacked portion 100b.

The columnar portions CL1 are disposed in the cell array region. The columnar portions CL1 are formed in substantially circular columnar configurations extending through the first stacked portion 100a in the stacking direction of the first stacked portion 100a (the Z-direction).

As shown in FIG. 2, for example, the columnar portions CL1 have a staggered arrangement. Or, the columnar portions CL1 may have a square lattice arrangement along the X-direction and the Y-direction.

As shown in FIG. 2, the separation portions 60 extend in the X-direction through the cell array region and the stairstep region, and divide the stacked body 100 into multiple blocks (or finger portions) 200 in the Y-direction.

As shown in FIG. 3, the multiple bit lines BL are provided above the first stacked portion 100a. The bit lines BL are, for example, metal films extending in the Y-direction. The bit lines BL are separated from each other in the X-direction.

The upper ends of semiconductor bodies 20 of the columnar portions CL1 described below are connected to the bit lines BL via contacts Cb and contacts V1 shown in FIG. 3.

The columnar portions CL1 are connected to one common bit line BL. The columnar portions CL1 that are connected to the common bit line BL include one columnar portion CL selected from each block 200 divided in the Y-direction by the separation portions 60.

As shown in FIG. 4, the first stacked portion 100a includes multiple electrode layers 70 stacked on the substrate 10. The electrode layers 70 are stacked, with insulating layers 72 interposed, in a direction (the Z-direction) perpendicular to a major surface of the substrate 10. The electrode layer 70 is a metal layer. The electrode layer 70 is, for example, a tungsten layer including tungsten as a major component or a molybdenum layer including molybdenum as a major component. The insulating layer 72 is a silicon oxide layer including silicon oxide as a major component.

The substrate 10 is, for example, a silicon substrate; and an active region 10a is provided as a semiconductive foundation layer on the front surface side of the substrate 10. The active region 10a is for example, a P-type silicon region.

An insulating layer 41 is provided on the front surface of the active region 10a. The lowermost electrode layer 70 is provided on the insulating layer 41. An insulating layer 42 is provided on the uppermost electrode layer 70; and an insulating layer 43 is provided on the insulating layer 42. The insulating layer 43 covers the upper ends of the columnar portions CL1.

Figure 5A:
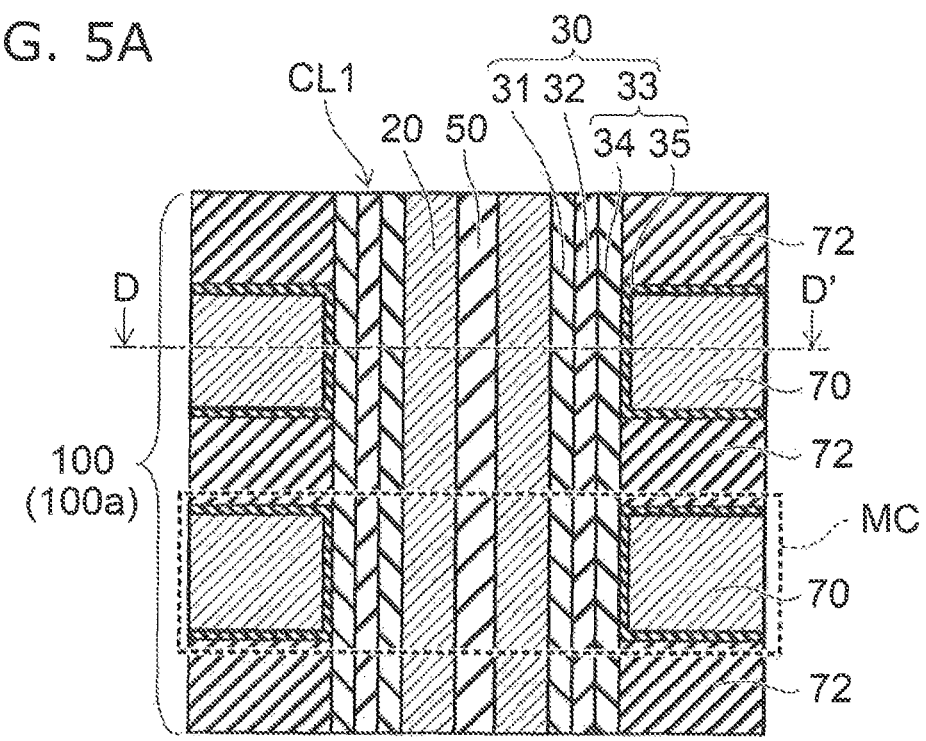
FIG. 5A is an enlarged cross-sectional view of one portion of FIG. 4.

FIG. 5A is an enlarged cross-sectional view of one portion of FIG. 4.

Figure 5B:
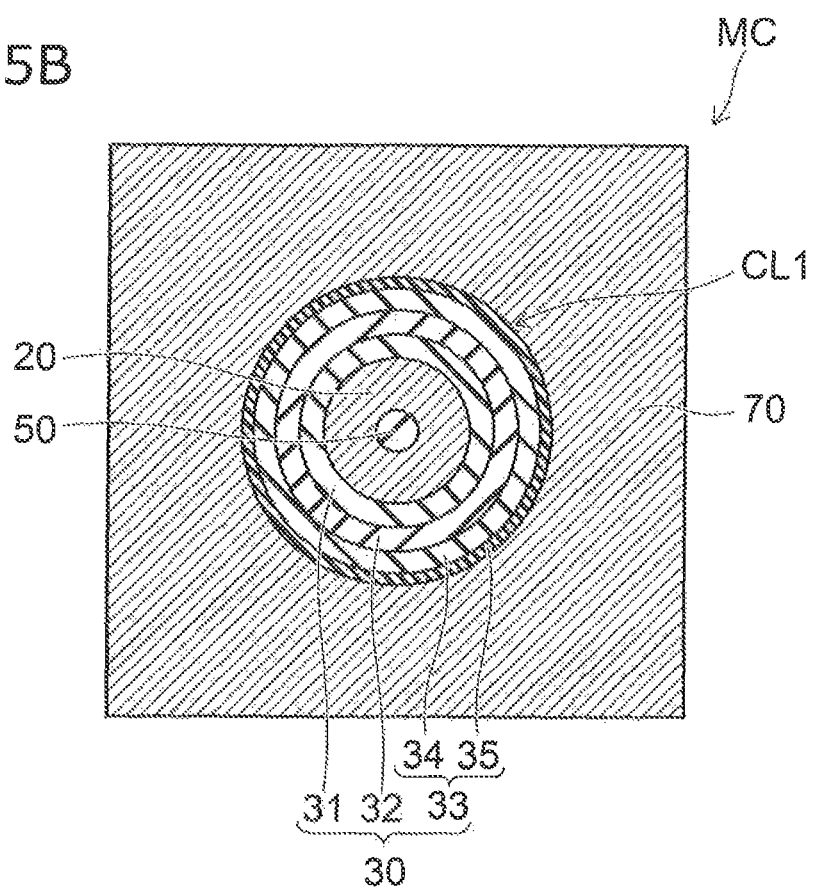
FIG. 5B is a D-D' cross-sectional view of FIG. 5A.

FIG. 5B is a D-D' cross-sectional view of FIG. 5A.

The columnar portion CL1 includes a stacked film (a memory film) 30, the semiconductor body 20, and an insulative core film 50.

The semiconductor body 20 extends to be continuous in a pipe-like configuration through the first stacked portion 100a in the stacking direction (the Z-direction). The stacked film 30 is provided between the semiconductor body 20 and the electrode layers 70, and surrounds the semiconductor body 20 from the outer circumferential side. The core film 50 is provided on the inner side of the semiconductor body 20 having the pipe-like configuration. The upper end of the semiconductor body 20 is connected to the bit line BL via the contact Cb and the contact V1 shown in FIG. 3.

The stacked film 30 includes a tunneling insulating film 31, a charge storage film (a charge storage portion) 32, and a blocking insulating film 33. The tunneling insulating film 31, the charge storage film 32, and the blocking insulating film 33 are provided in order from the semiconductor body 20 side between the semiconductor body 20 and the electrode layers 70. The charge storage film 32 is provided between the tunneling insulating film 31 and the blocking insulating film 33.

The semiconductor body 20, the stacked film 30, and the electrode layer 70 are included in a memory cell MC. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32, or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes a first blocking film 34 and a second blocking film 35. The first blocking film 34 is, for example, a silicon oxide film. The second blocking film 35 is a metal oxide film having a higher dielectric constant than that of the silicon oxide film. For example, an aluminum oxide film, a zirconium oxide film, or a hafnium oxide film may be examples of the metal oxide film.

The first blocking film 34 is provided between the charge storage film 32 and the second blocking film 35. The second blocking film 35 is provided between the first blocking film 34 and the electrode layer 70.

The second blocking film 35 is provided also between the electrode layer 70 and the insulating layer 72. The second blocking film 35 is formed to be continuous along the upper surface of the electrode layer 70, the lower surface of the electrode layer 70, and the side surface of the electrode layer 70 on the stacked film 30 side. The second blocking film 35 is not continuous in the stacking direction of the first stacked portion 100a and is divided.

Or, the second blocking film 35 may be formed to be continuous along the stacking direction of the first stacked portion 100a without forming the second blocking film 35 between the electrode layer 70 and the insulating layer 72.

Or, the blocking insulating film 33 may be a single-layer film continuous along the stacking direction of the first stacked portion 100a.

Also, a metal nitride film may be formed between the second blocking film 35 and the electrode layer 70, or between the insulating layer 72 and the electrode layer 70. The metal nitride film is, for example, a titanium nitride film and can function as a barrier metal, an adhesion layer, or a seed metal of the electrode layer 70.

As shown in FIG. 3, a drain-side selection transistor STD is provided at the upper layer portion of the first stacked portion 100a (the upper end portion of the columnar portion CL1). A source-side selection transistor STS is provided at the lower layer portion of the first stacked portion 100a (the lower end portion of the columnar portion CL1). At least the uppermost electrode layer 70 functions as a control gate of the drain-side selection transistor STD. At least the lowermost electrode layer 70 functions as a control gate of the source-side selection transistor STS.

The multiple memory cells MC are provided between the drain-side selection transistor STD and the source-side selection transistor STS. The memory cells MC, the drain-side selection transistor STD, and the source-side selection transistor STS are connected in series via the semiconductor body 20 of the columnar portion CL1, and are included in one memory string. For example, the memory strings have a staggered arrangement in a planar direction parallel to the XY plane; and the memory cells MC are provided three-dimensionally in the X-direction, the V-direction, and the Z-direction.

The separation portion 60 will now be described.

As shown in FIG. 2 and FIG. 4, the separation portion 60 includes an interconnect portion LI and an insulating film 63. The insulating film 63 is not illustrated in FIG. 3.

The interconnect portion LI spreads in the X-direction and the Z-direction and is, for example, a film including a metal. The insulating film 63 is provided on the side surface of the interconnect portion LI. As shown in FIG. 4, the insulating film 63 is provided between the first stacked portion 100a and the interconnect portion LI.

As shown in FIG. 4, the lower end of the semiconductor body 20 of the columnar portion CL1 contacts the active region 10a of the substrate 10.

Multiple semiconductor regions 81 are formed in the front surface of the active region 10a. The lower ends of the interconnect portions LI contact the semiconductor regions 81. The multiple semiconductor regions 81 are provided to correspond to the multiple interconnect portions LI. The semiconductor regions 81 include an N-type semiconductor region 81 and a P-type semiconductor region 81.

The interconnect portions LI include the interconnect portion LI that is connected to the N-type semiconductor region 81, and the interconnect portion LI that is connected to the P-type semiconductor region 81.

The upper end of the interconnect portion LI connected to the N-type semiconductor region 81 is connected to the source line SL via a contact Cs shown in FIG. 3.

By controlling the potential applied to the lowermost electrode layer 70, an N-channel (an inversion layer) can be induced in the front surface of the P-type active region 10a between the N-type semiconductor region 81 and the lower end of the semiconductor body 20; and a current can be caused to flow between the N-type semiconductor region 81 and the lower end of the semiconductor body 20. The lowermost electrode layer 70 functions as a control gate for inducing the channel in the front surface of the active region 10a; and the insulating layer 41 functions as a gate insulating film.

In a read operation, electrons are supplied from the interconnect portion LI to the semiconductor body 20 via the N-type semiconductor region 81 and the N-channel.

The upper end of the interconnect portion LI that is connected to the P-type semiconductor region 81 is connected to a not-illustrated upper layer interconnect. The P-type semiconductor region 81 supplies holes to the semiconductor body 20 via the active region 10a in an erasing operation.

The structure of the stairstep region where the stairstep portion 2 is provided will now be described.

Figure 6:
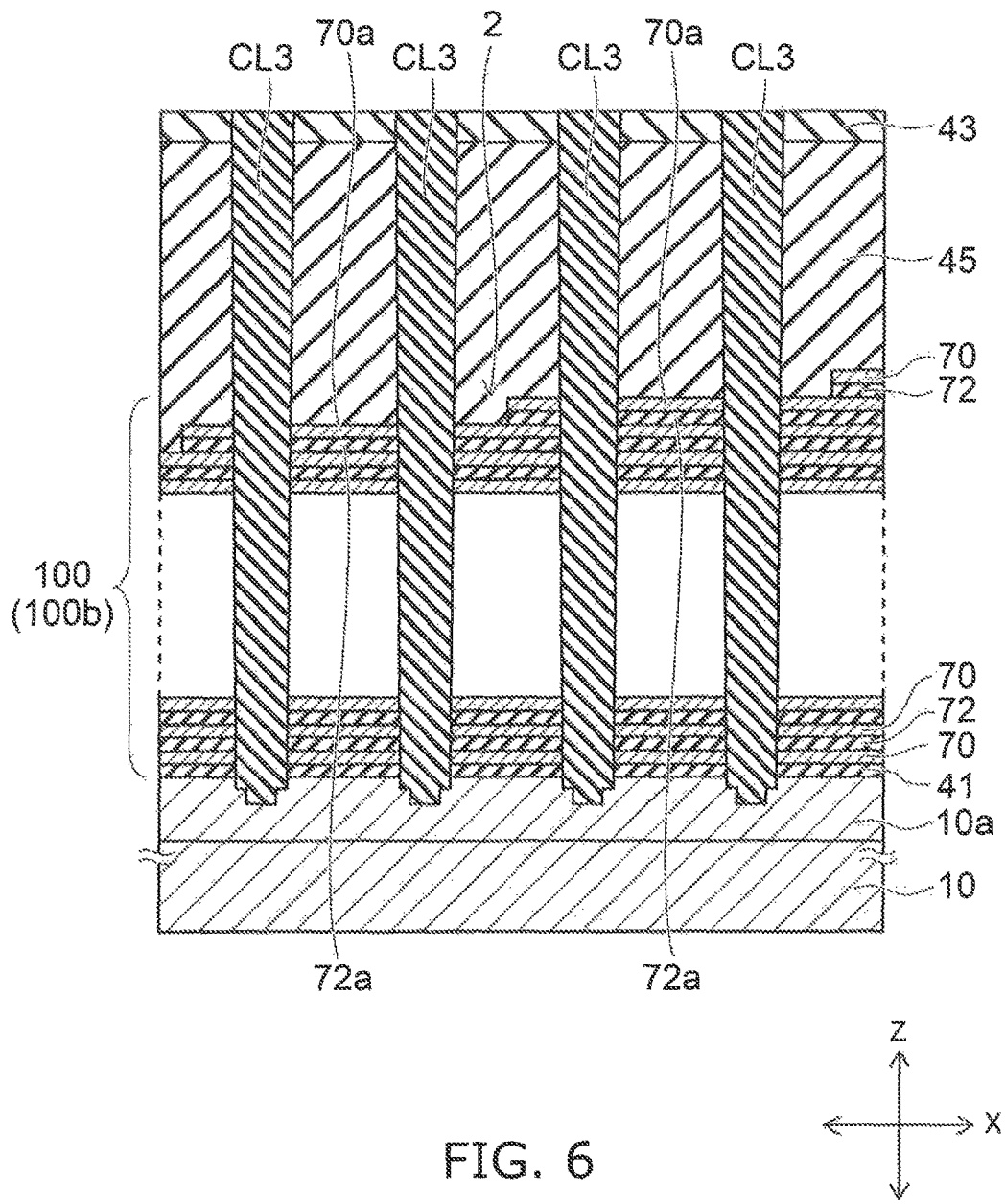
FIG. 6 is an B-B' cross-sectional view of FIG. 2.

FIG. 6 is a B-B' cross-sectional view of FIG. 2.

Figure 7:
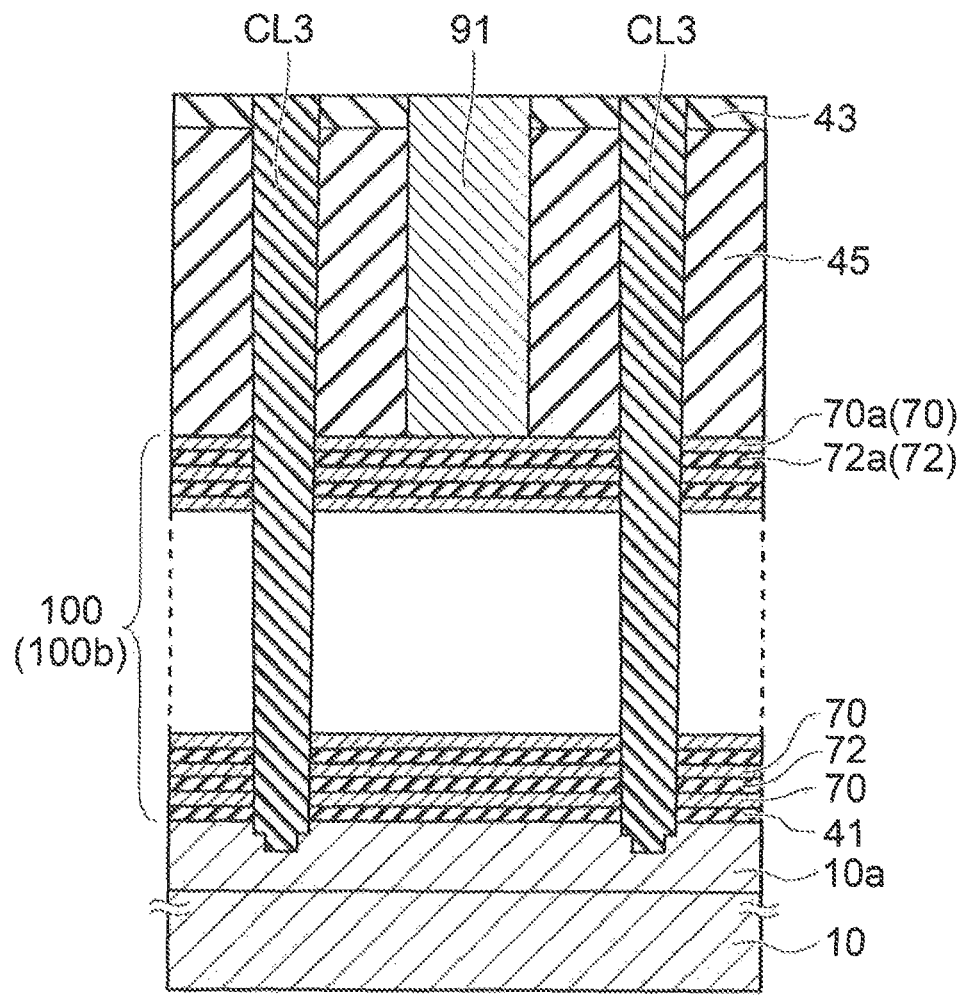
FIG. 7 is an C-C' cross-sectional view of FIG. 2.

FIG. 7 is a C-C' cross-sectional view of FIG. 2.

The stacked body 100 and the separation portions 60 extend in the X-direction from the cell array region to the stairstep region. The separation portions 60 divide the second stacked portion 100b of the stairstep region into the multiple blocks 200 in the Y-direction.

As shown in FIG. 6, the multiple electrode layers 70 of the second stacked portion 100b have multiple terrace portions 70a arranged in a stairstep configuration with differences in levels along the X-direction. The stairstep portion 2 is formed of the multiple terrace portions 70a. All of the electrode layers 70 and insulating layers 72 of the upper layers above the terrace portions 70a are removed and do not remain. Another upper electrode layer 70 above the arbitrary layer having the terrace portion 70a does not overlap the terrace portions 70a.

One portion of the insulating layers 72 of the second stacked portion 100b also is patterned into a stairstep configuration; and the insulating layers 72 have terrace portions 72a arranged in a stairstep configuration with differences in levels along the X-direction. The terrace portions 70a of the electrode layers 70 are stacked on the terrace portions 72a of the insulating layers 72.

An insulating layer 45 is provided on the stairstep portion 2. The insulating layer 45 fills the differences in levels of the stairstep portion 2, and eliminates or relaxes the difference in levels between the second stacked portion 100b and the first stacked portion 100a. The insulating layer 45 is a silicon oxide layer including silicon oxide as a major component.

The insulating layer 43 is provided on the insulating layer 45. The insulating layer 43 is the same as the insulating layer 45, e.g., a silicon oxide layer.

Multiple columnar portions CL3 that extend in the stacking direction of the stacked body 100 (the Z-direction) are provided inside the insulating layer 45 and inside the second stacked portion 100b under the insulating layer 45. Because the electrode layers 70 and the Insulating layers 72 of the upper layers above the terrace portions 70a of the electrode layers 70 of the second stacked portion 100b all are removed, of the side surfaces of the columnar portions CL3, the side surfaces of the columnar portion CL3 portions extending through the insulating layer 45 are separated from the electrode layers 70 and do not contact the electrode layers 70 of the upper layers.

As shown in FIG. 2, at least one columnar portion CL3 is disposed at one terrace portion 70a. In the example shown in FIG. 2, for example, four columnar portions CL3 are disposed at one terrace portion 70a.

The columnar portion CL3 is an insulator having a substantially circular columnar configuration. The columnar portion CL3 includes, for example, silicon nitride as a major component as an insulating material that is different from the insulating layer 45. The columnar portion CL3 is substantially a pillar of simple silicon nitride.

As shown in FIG. 6, the columnar portions CL3 pierce the insulating layer 43, the insulating layer 45, and the second stacked portion 100b under the insulating layer 45, and reach the active region 10a of the substrate 10. The columnar portions CO pierce the terrace portions 70a. The lengths in the Z-direction of the multiple columnar portions CO are substantially equal to each other.

As shown in FIG. 2 and FIG. 7, contact portions 91 are provided on the terrace portions 70a. At least one contact portion 91 is disposed at one terrace portion 70a. The multiple contact portions 91 are provided on the stairstep portion 2 to correspond to the multiple terrace portions 70a.

The contact portion 91 is a conductor having a substantially circular columnar configuration. The contact portion 91 is a metal body, and includes, for example, tungsten or molybdenum as a major component.

The contact portions 91 extend in the stacking direction of the stacked body 100 through the insulating layer 45, and are connected to the terrace portions 70a. The peripheries of the contact portions 91 are surrounded with the insulating layer 45.

The contact portions 91 are connected to not-illustrated upper layer interconnects. For example, the upper layer interconnects are electrically connected to a control circuit formed in the front surface of the substrate 10. The potential of the electrode layer 70 of each layer of the memory cell array 1 is controlled via the contact portions 91 and the terrace portions 70a.

In the example shown in FIG. 2, four columnar portions CL3 are disposed at the periphery of one contact portion 91 in one terrace portion 70a.

The diameters of the contact portions 91 are larger than the diameters of the columnar portions CL3 of the stairstep region and the diameters of the columnar portions CL1 of the memory cell array 1. The columnar portions CL1 of the memory cell array 1 are arranged more densely than the columnar portions CL3 of the stairstep region.

A hole pattern is formed by lithography in a not-illustrated resist film formed on the insulating layer 43; the hole pattern is transferred to the insulating layer 43 and the insulating layer 45 directly from the resist film or via a mask layer; and contact holes CH shown in FIG. 27 described below are formed. The contact portions 91 are formed inside the contact holes CH. There are cases where the contact holes CH are shifted to positions where the contact holes CH overlap the columnar portions CL3 according to the lithography precision of the resist film.

According to the embodiment, because the columnar portions CL3 are insulators of a material that is different from the insulating layer 45, the etching rate of the columnar portions CL3 can be sufficiently low with respect to the etching rate of the insulating layer 45 when forming the contact holes CH.

Therefore, even if the positions where the contact holes CH are formed undesirably overlap the columnar portions CL3, the etching of portions of the columnar portions CL3 that overlap the contact holes CH in the vertical direction can be suppressed in the etching that forms the contact holes CH. The formation, of holes or spaces, that extending in the vertical direction and exposing the electrode layers 70, at the outer circumferential of the columnar portions CL3 can be suppressed. This prevents the formation of a conductive material that causes shorts between the electrode layers 70.

Thus, according to the embodiment, the overlap of the positions of the contact holes CH and the columnar portions CL3 i.e., contact between the contact portions 91 and the columnar portions CL3, can be allowed. This makes it possible to reduce the distance between the contact portion 91 and the columnar portion CL3; and the surface area of one terrace portion 70a where the contact portions 91 and the columnar portions CL3 are disposed can be set to be small. This leads to the reduction of the chip size.

Among the multiple columnar portions CL3 and the multiple contact portions 91, the shortest distance between the columnar portion CL3 and the contact portion 91 disposed inside the same terrace portion 70a is substantially equal between the multiple terrace portions 70a. The shortest distance between the contact portion 91 and the columnar portion CL3 inside one terrace portion 70a is substantially equal to the shortest distance between the contact portion 91 and the columnar portion CL3 inside another terrace portion 70a. The distance (the shortest distance) between the contact portion 91 and the columnar portion CL3 is substantially uniform and does not fluctuate between the multiple terrace portions 70a.

Figure 38:
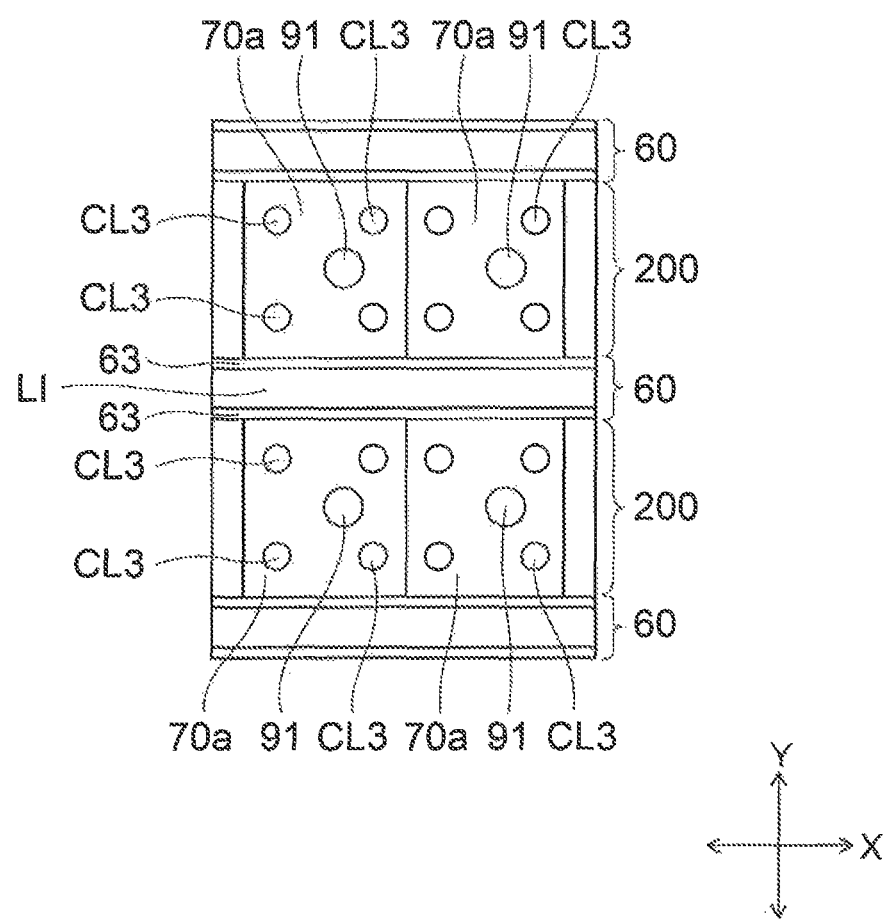
FIG. 38 is a schematic plan view of the semiconductor device of the embodiment.

In the case where positional shift of the hole patterns occurs in the lithography, there is a tendency for the hole patterns to shift about the same amount in the same direction, An example is shown in FIG. 38 in which the contact portions 91 (the hole pattern) are shifted further toward the right side in the X-direction than the example shown in FIG. 2. Because the hole patterns shift about the same amount in the same direction, even in the case where the positional shift of the hole patterns occurs, the shortest distance between the columnar portion CD and the contact portion 91 disposed inside the same terrace portion 70a is substantially equal between the terrace portions 70a.

Thus, according to the embodiment, because the distance between the contact portion 91 and the columnar portion CL3 does not fluctuate and is uniform between the terrace portions 70a, the margin of the size of the terrace portion 70a can be set to be small. This also makes it possible to reduce the surface area of the terrace portion 70a and leads to the reduction of the chip size.

A method for manufacturing the semiconductor device of the embodiment will now be described.

First, the processes for the first stacked portion 100a of the cell array region will be described with reference to FIG. 8 to FIG. 18.

Figure 8:
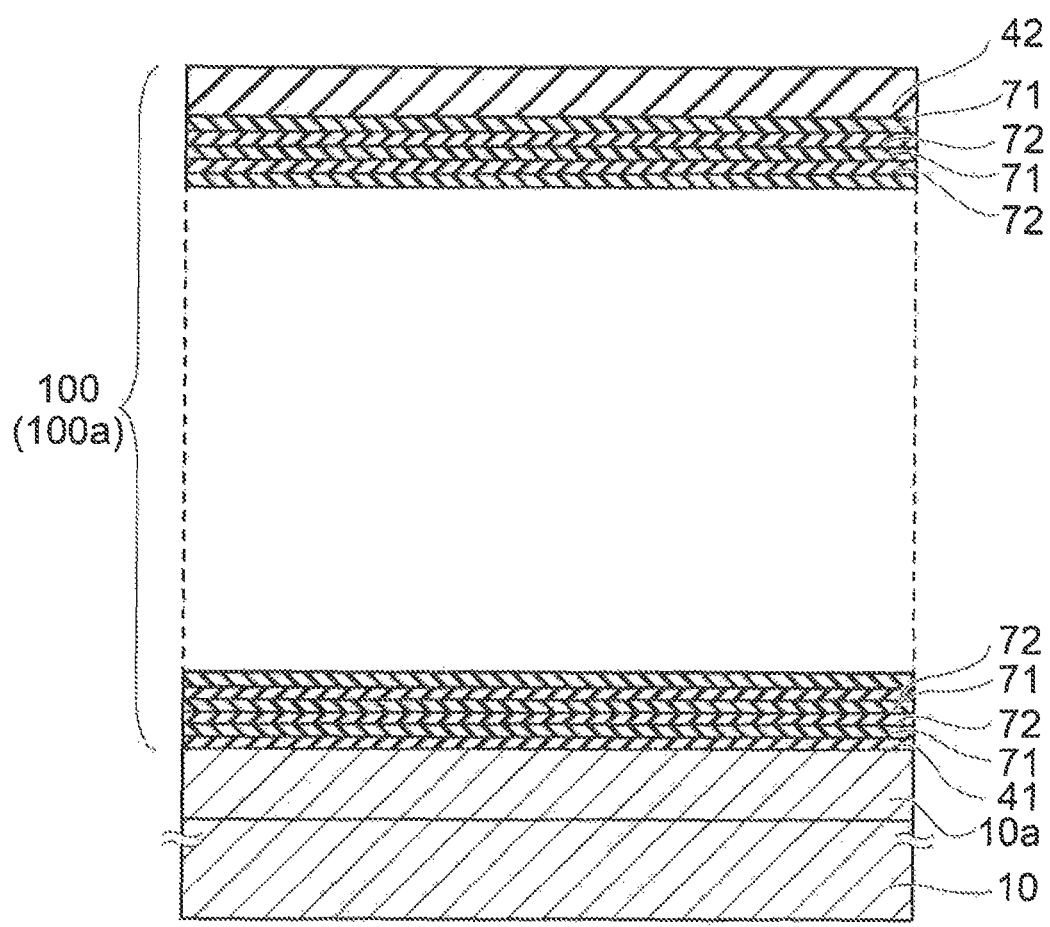
FIGS. 8 to 25 are schematic cross-sectional views showing a method for manufacturing the semiconductor device of the embodiment.

As shown in FIG. 8, the insulating layer 41 is formed on the active region 10a of the substrate 10. A sacrificial layer 71 as a first layer and the insulating layer 72 as a second layer are stacked alternately on the insulating layer 41. The process of alternately stacking the sacrificial layer 71 and the insulating layer 72 is repeated; and the multiple sacrificial layers 71 and the multiple insulating layers 72 are formed on the substrate 10. The insulating layer 42 is formed on the uppermost sacrificial layer 71. For example, the sacrificial layers 71 are silicon nitride layers; and the insulating layers 72 are silicon oxide layers.

Figure 9:
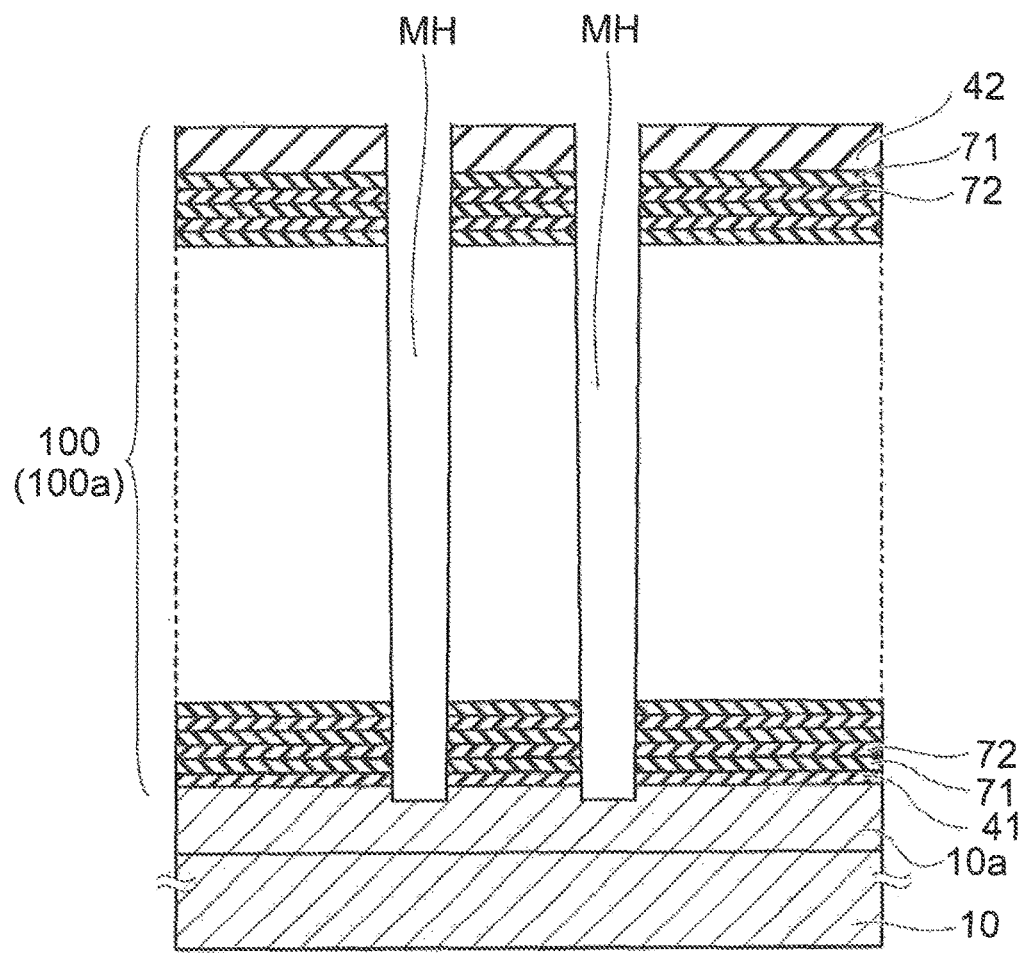

As shown in FIG. 9, multiple memory holes MH are formed in the first stacked portion 100a of the cell array region including the sacrificial layers 71 and the insulating layers 72. The memory holes MH are formed by reactive ion etching (RIE) using a not-illustrated mask layer. The memory holes MH pierce the insulating layer 42, the sacrificial layers 71, the insulating layers 72, and the insulating layer 41, and reach the active region 10a.

Figure 10:
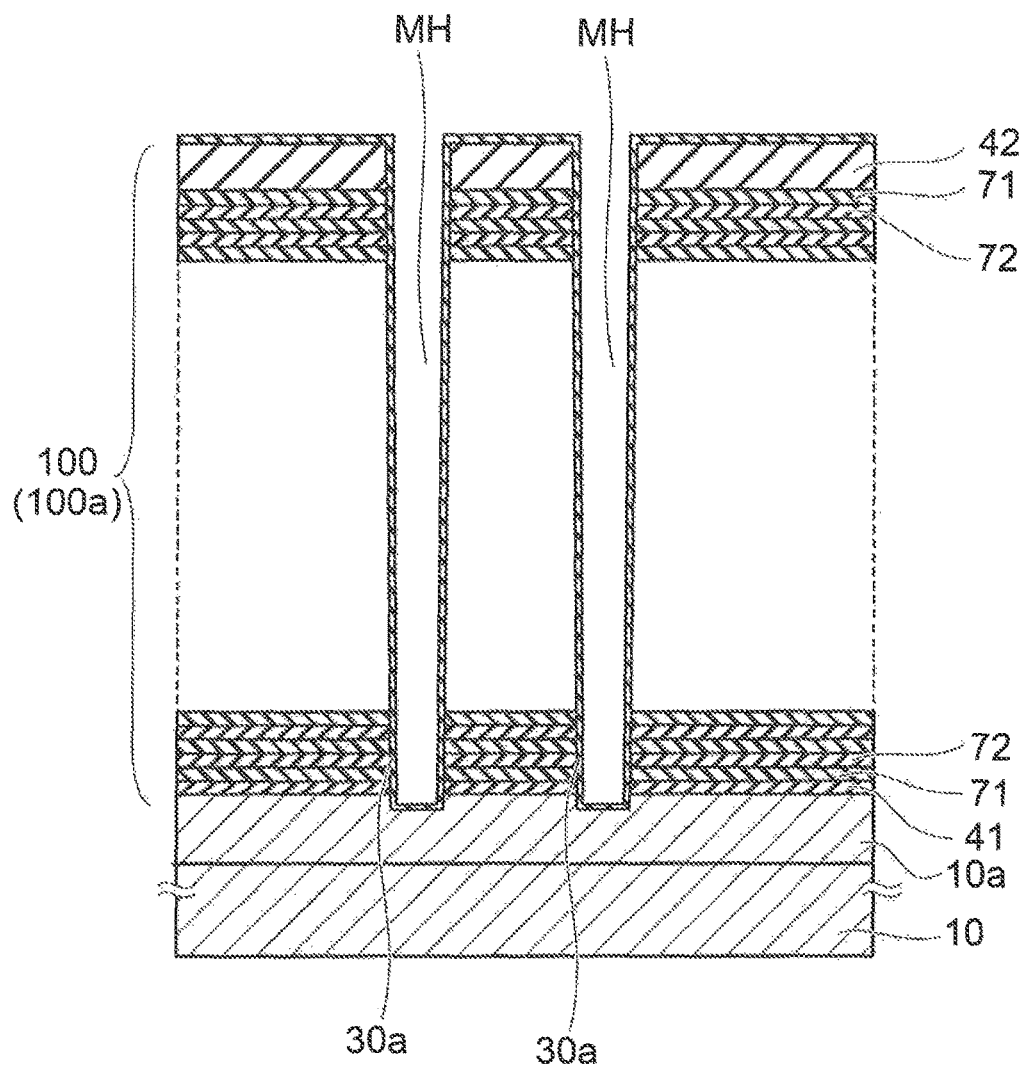

As shown in FIG. 10, a stacked film 30a is formed inside the memory holes MH. The stacked film 30a is formed conformally along the side surfaces and bottoms of the memory holes MH. The stacked film 30a includes, for example, the tunneling insulating film 31, the charge storage film 32, and the first blocking film 34 of the stacked film 30 shown in FIG. 5A and FIG. 5B. The first blocking film 34, the charge storage film 32, and the tunneling insulating film 31 are formed in order inside the memory holes MH.

Figure 11:
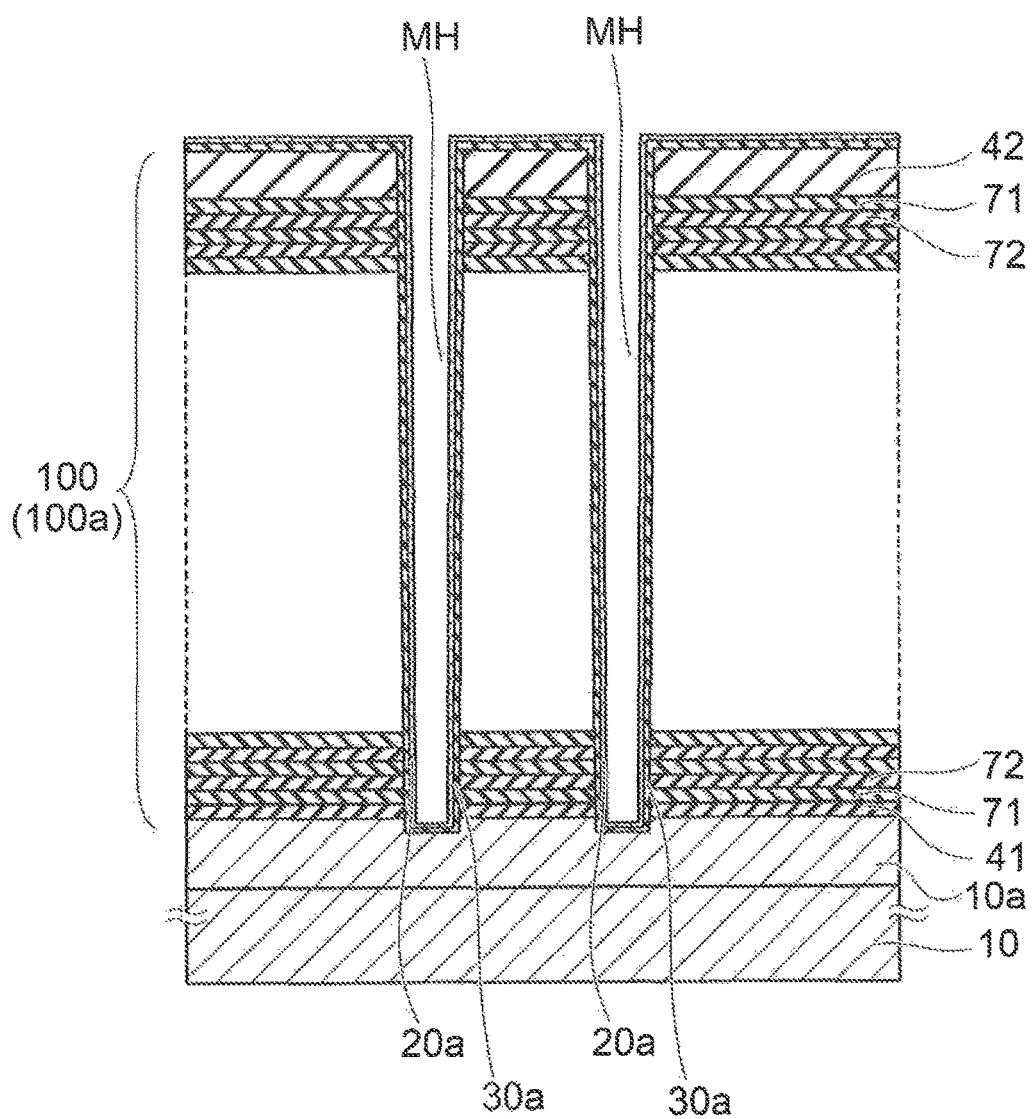

As shown in FIG. 11, cover silicon 20a is formed on the inner side of the stacked film 30a. The cover silicon 20a is formed conformally along the side surfaces and bottoms of the memory holes MH.

Figure 12:
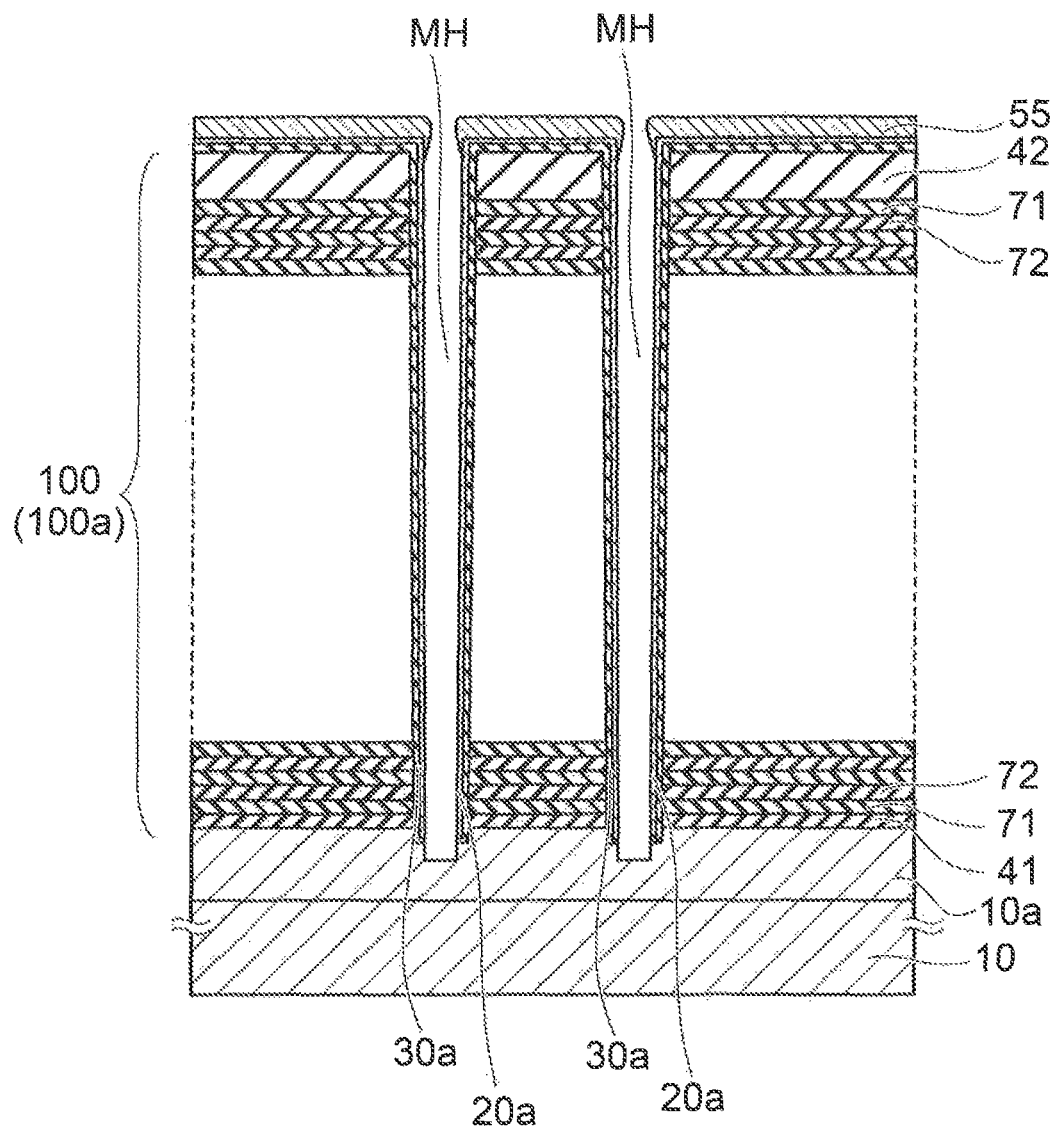

Then, as shown in FIG. 12, a mask layer 55 is formed on the insulating layer 42; and the cover silicon 20a and the stacked film 30a deposited on the bottoms of the memory holes MH are removed by RIE. In the RIE, the stacked film 30a formed on the side surfaces of the memory holes MH is covered with and protected by the cover silicon 20a and is not damaged by the RIE.

Figure 13:
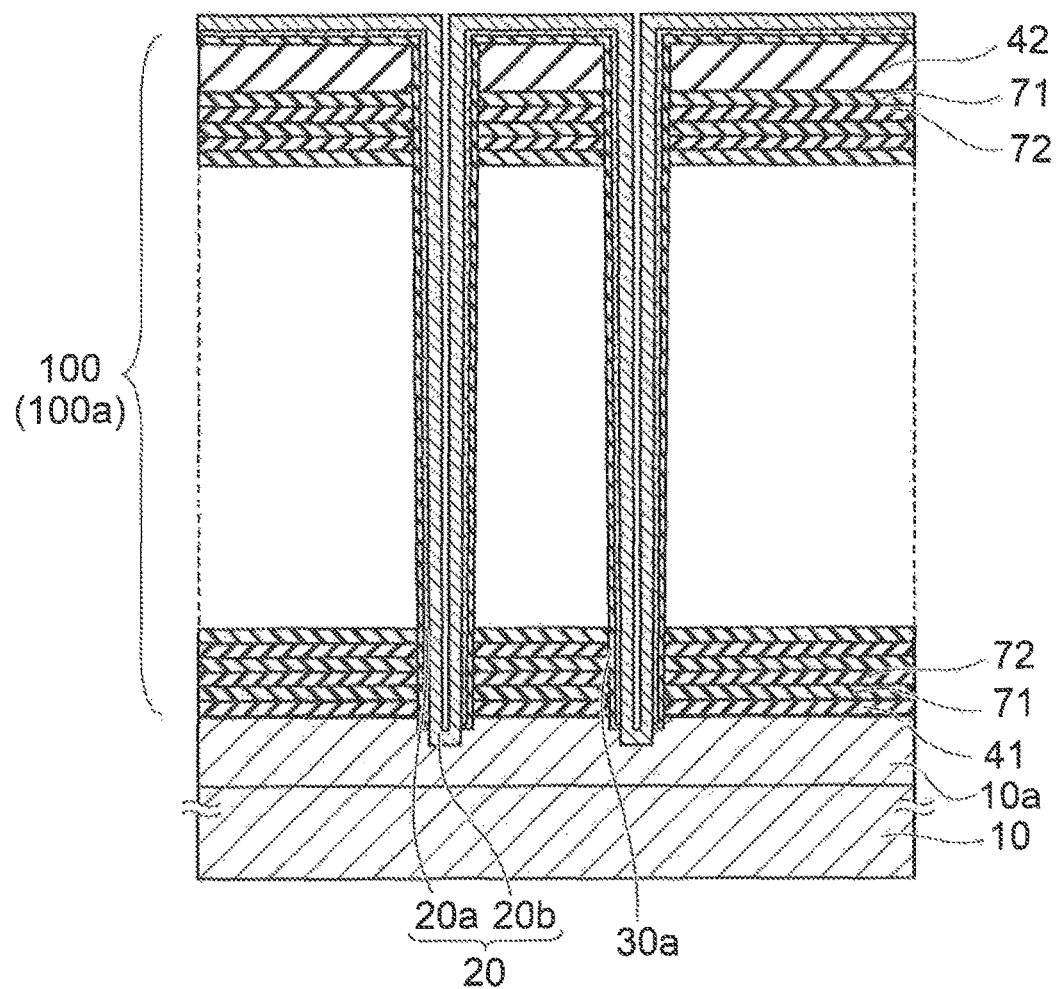

After removing the mask layer 55, a silicon body 20b is formed inside the memory holes MH as shown in FIG. 13. The silicon body 20b is formed on the side surface of the cover silicon 20a and the active region 10a at the bottoms of the memory holes MH. The lower end of the silicon body 20b contacts the active region 10a.

For example, the cover silicon 20a and the silicon body 20b are formed as amorphous silicon films, and subsequently crystallized into polycrystalline silicon, films by heat treatment.

Figure 14:
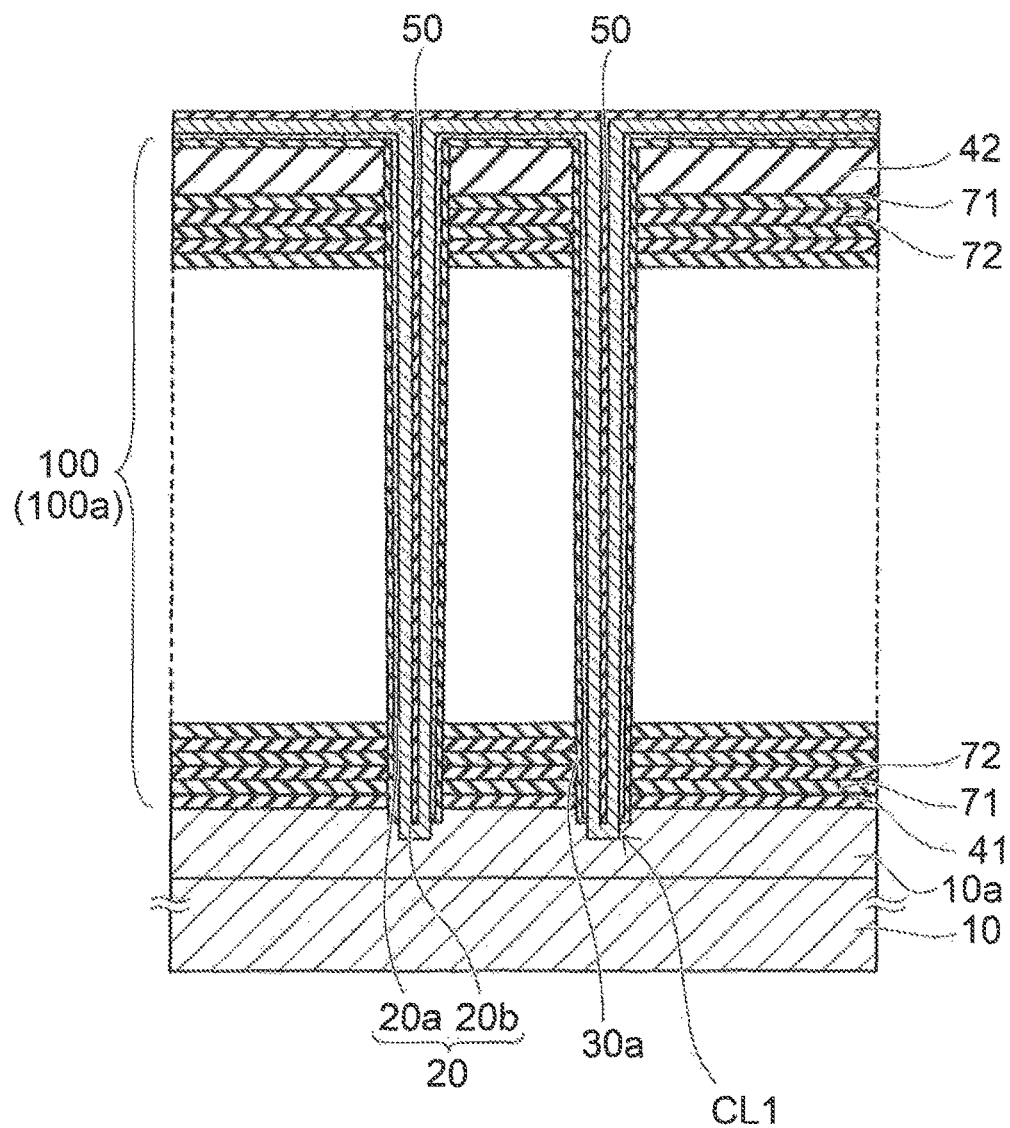

As shown in FIG. 14, the core film 50 is formed on the inner side of the silicon body 20b. The multiple columnar portions CL1 that include the stacked film 30a, the semiconductor body 20, and the core film 50 are formed inside the first stacked portion 100a.

The films deposited on the insulating layer 42 shown in FIG. 14 are removed by chemical mechanical polishing (CMP) or etch-back.

Figure 15:
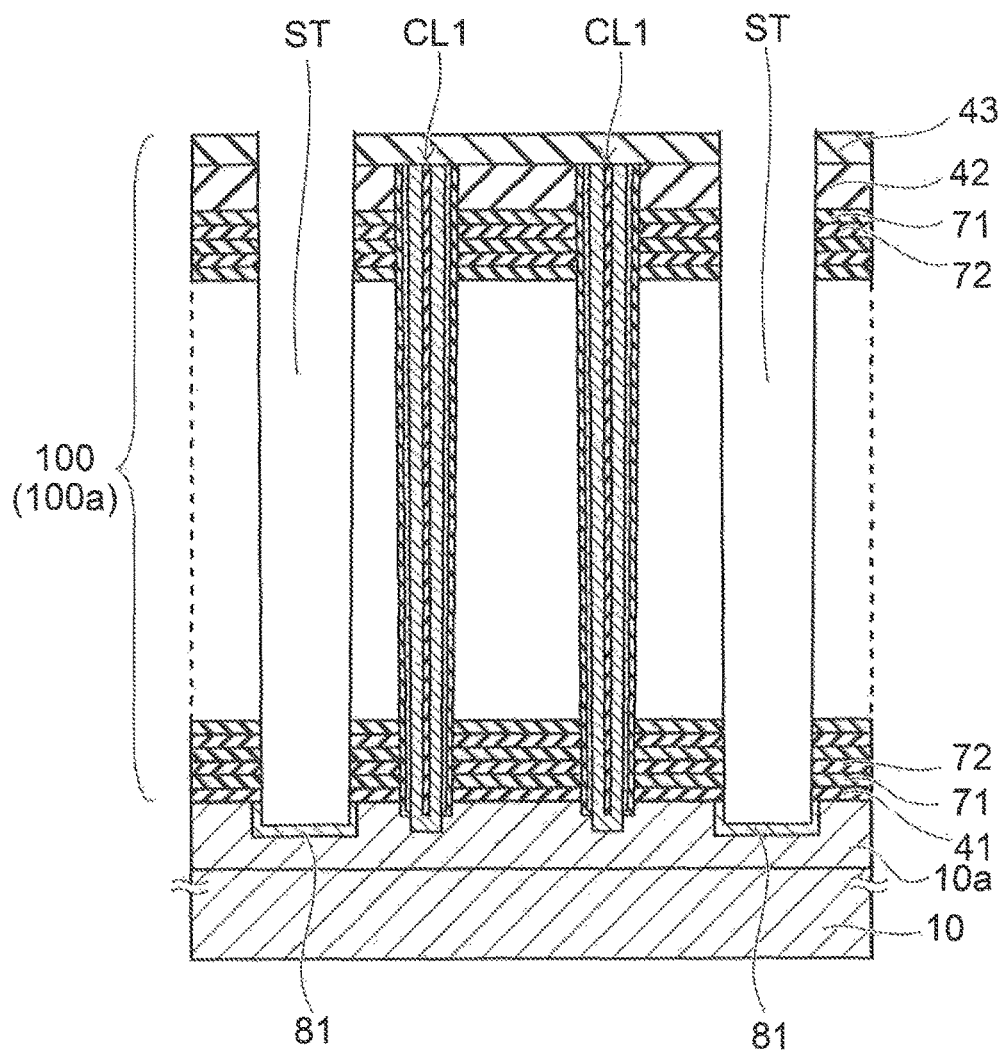

Subsequently, as shown in FIG. 15, the insulating layer 43 is formed on the insulating layer 42. The insulating layer 43 covers the upper ends of the columnar portions CL1.

Then, multiple slits ST are formed in the first stacked portion 100a by RIE using a not-illustrated mask layer. The slits ST pierce the insulating layer 43, the insulating layer 42, the sacrificial layers 71, the insulating layers 72, and the insulating layer 41, and reach the active region 10a. The slits ST extend in the X-direction as shown in FIG. 2, and are formed also in the second stacked portion 100b and the insulating layer 45 on the second stacked portion 100b.

The N-type or P-type semiconductor region 81 is formed in the front surface of the active region 10a at the bottoms of the slits ST by implanting an impurity by ion implantation into the active region 10a exposed at the bottoms of the slits ST.

Then, the sacrificial layers 71 are removed by an etchant or an etching gas supplied through the slits ST. For example, the sacrificial layers 71 which are silicon nitride layers are removed using an etchant including phosphoric acid.

Figure 16:
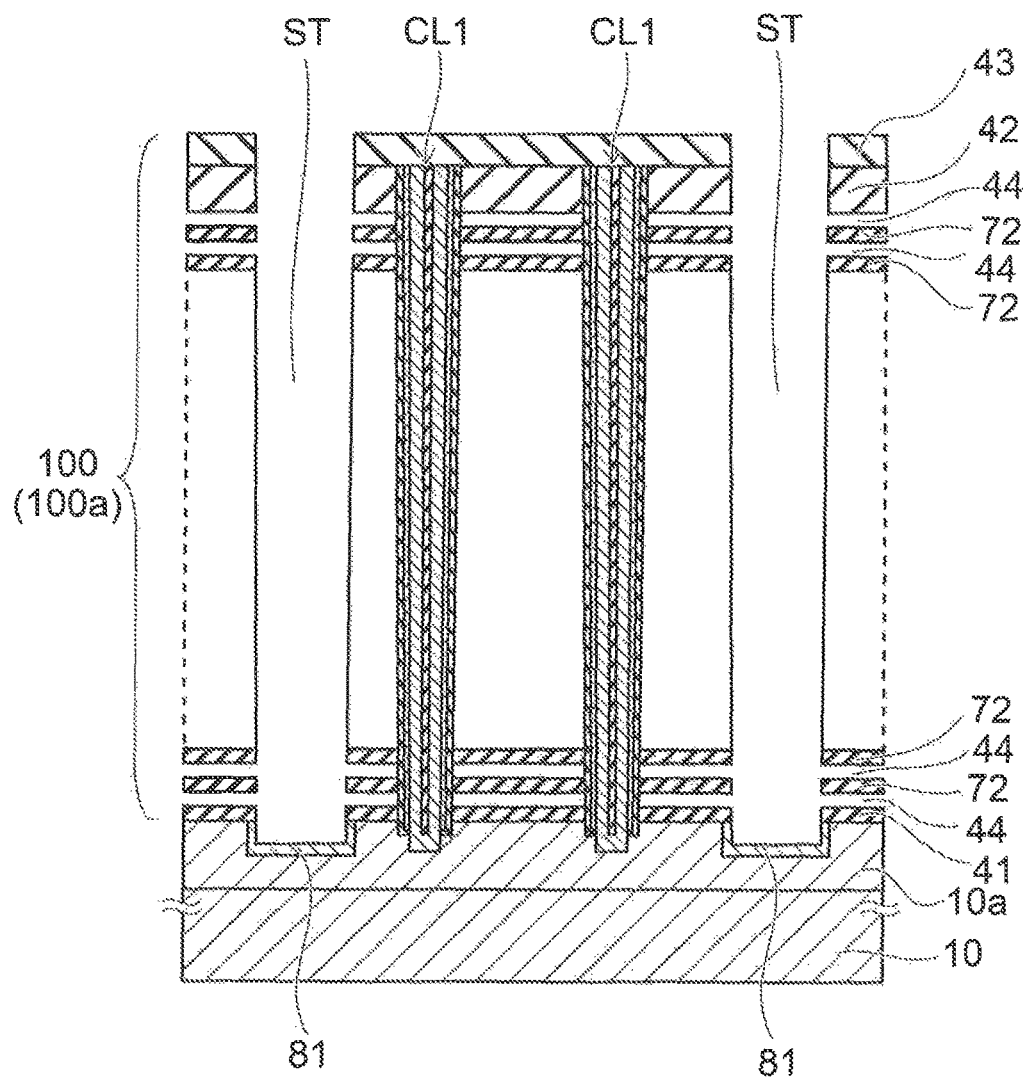

The sacrificial layers 71 are removed; and as shown in FIG. 16, a gap 44 is formed between the insulating layers 72 adjacent to each other above and below. The gap 44 is formed also between the insulating layer 41 and the lowermost insulating layer 72, and between the insulating layer 42 and the uppermost insulating layer 72.

The insulating layers 72 of the first stacked portion 100a contact the side surfaces of the first columnar portions CL1 to surround the side surfaces of the first columnar portions CL1. The insulating layers 72 are supported by such a physical bond with the columnar portions CL1; and the gaps 44 are maintained between the insulating layers 72.

Figure 17:
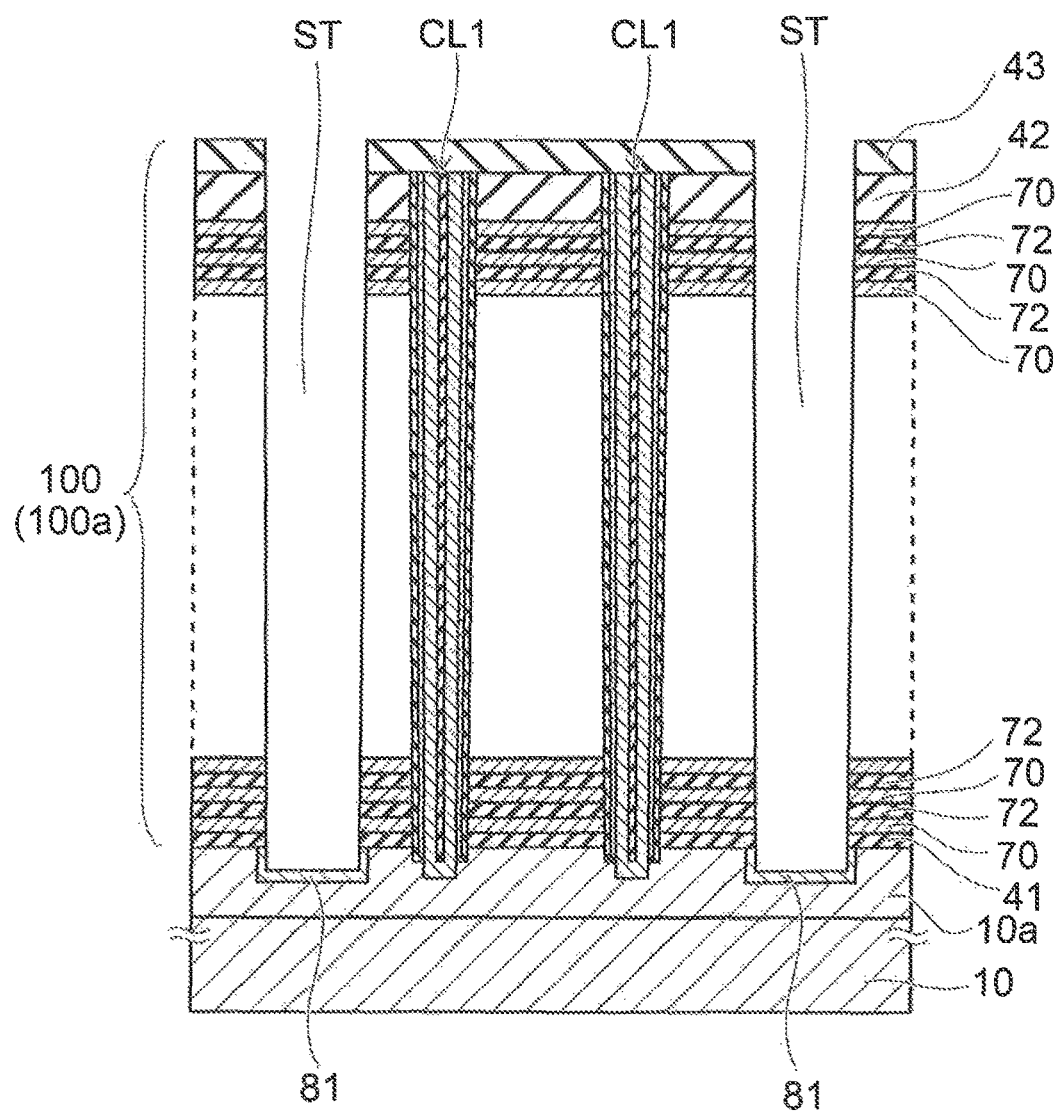

The electrode layers 70 shown in FIG. 17 are formed, with the second blocking films 35 shown in FIG. 5A interposed, in the gaps 44. For example, the second blocking films 35 and the electrode layers 70 are formed by chemical vapor deposition (CVD). A source gas is supplied to the gaps 44 through the slits ST. The electrode layers 70 formed on the side surfaces of the slits ST are removed.

Figure 18:
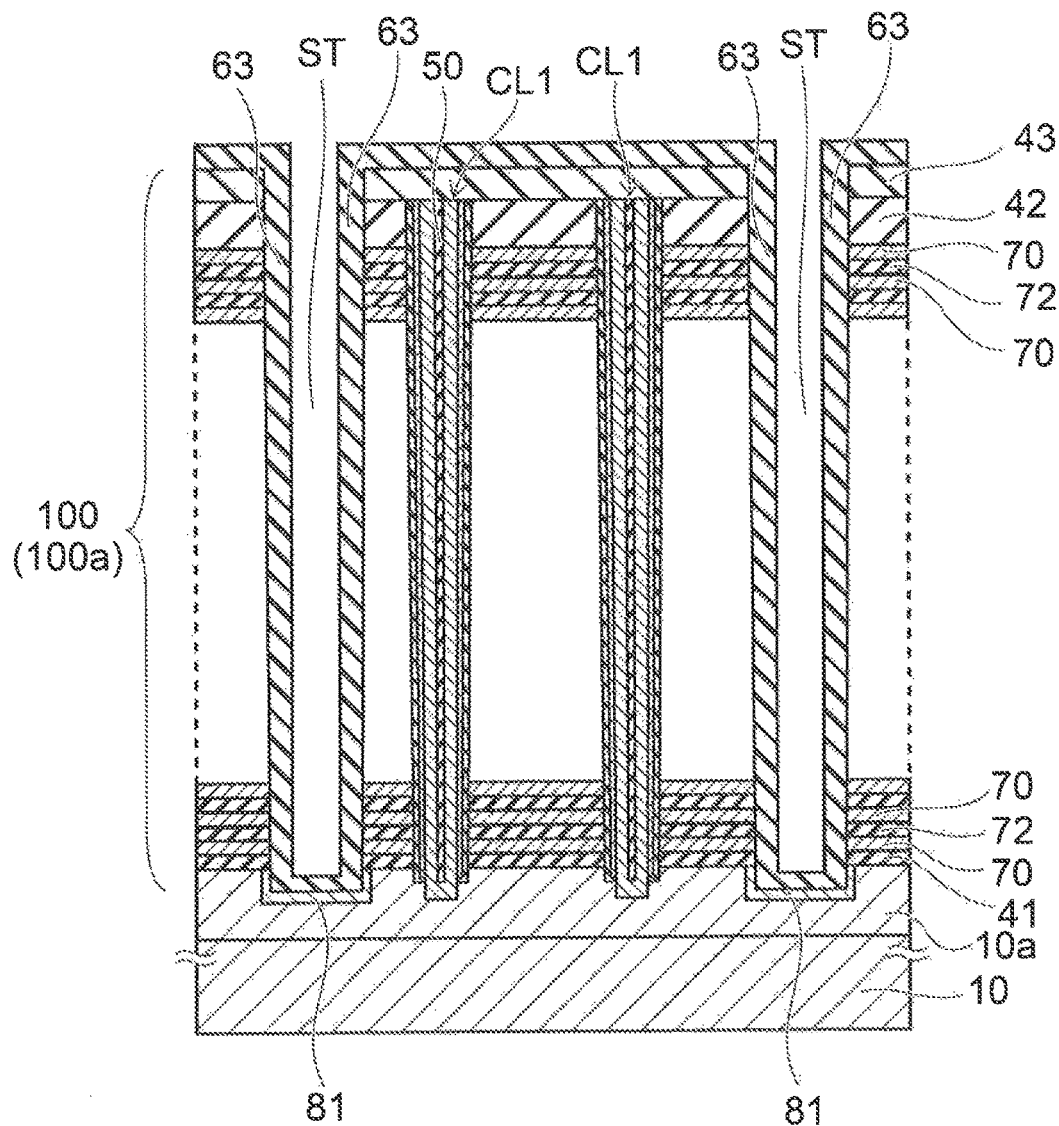

Subsequently, as shown in FIG. 18, the insulating film 63 is formed on the side surfaces and bottoms of the slits ST. After removing the insulating film 63 formed on the bottoms of the slits ST by RIE, the interconnect portion LI is filled into the inner side of the insulating film 63 inside the slits ST as shown in FIG. 4. The lower end portion of the interconnect portion LI contacts the active region 10a of the substrate 10 via the semiconductor region 81.

The processes for the second stacked portion 100b where the stairstep portion 2 is formed will now be described with reference to FIG. 19 to FIG. 27.

FIG. 19 to FIG. 25 are cross-sectional views corresponding to the B-B' cross section of FIG. 2.

Figure 19:
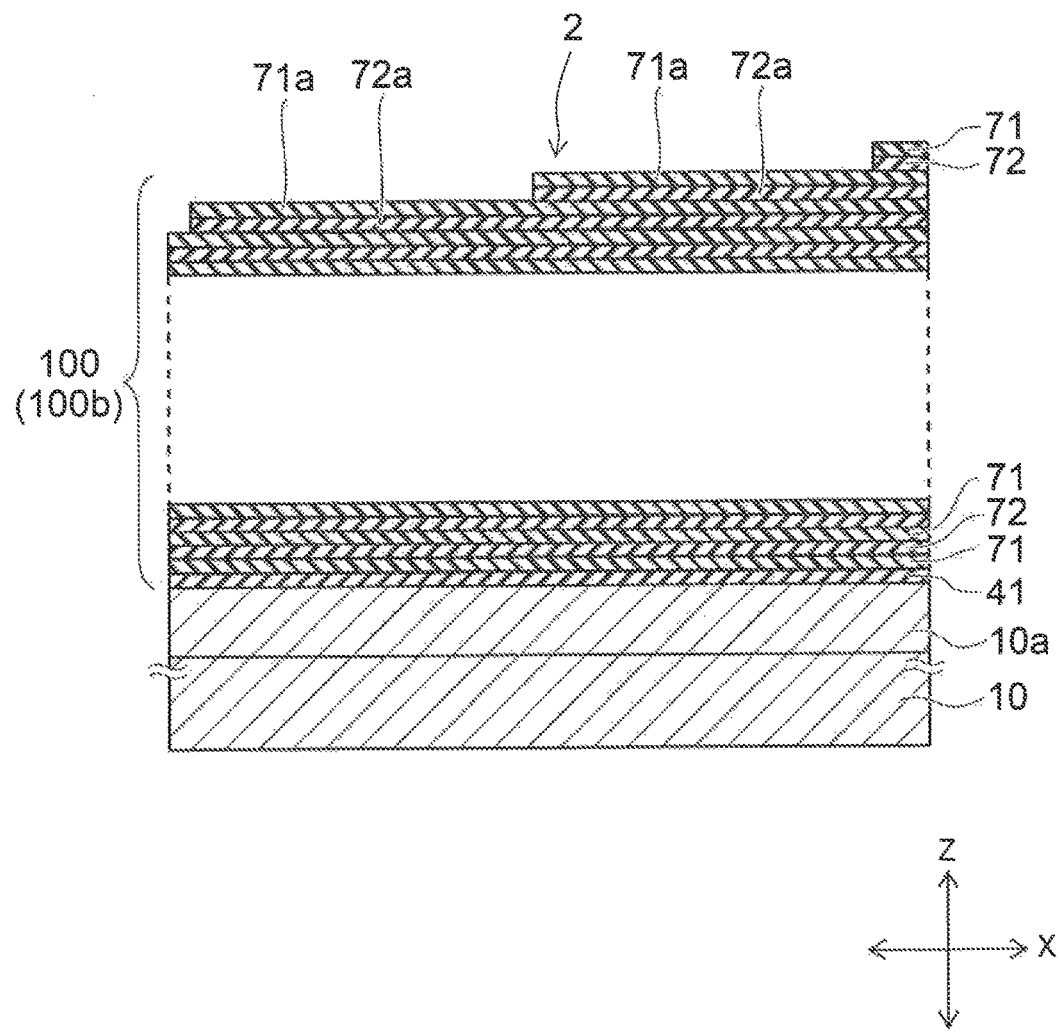

As shown in FIG. 19, the stairstep portion 2 is formed in a portion of the second stacked portion 100b prior to forming the memory holes MH described above. For example, RIE using a not-illustrated resist film as a mask, and the reduction of the planar size of the resist film are repeated; and the sacrificial layers 71 and the insulating layers 72 are patterned into a stairstep configuration along the X-direction. Multiple terrace portions 71a of the multiple sacrificial layers 71 are exposed at the uppermost face of the stairstep portion 2. The terrace portions 71a are arranged to have differences in levels in the X-direction. The terrace portions 72a of the insulating layers 72 are stacked under the terrace portions 71a.

Figure 20:
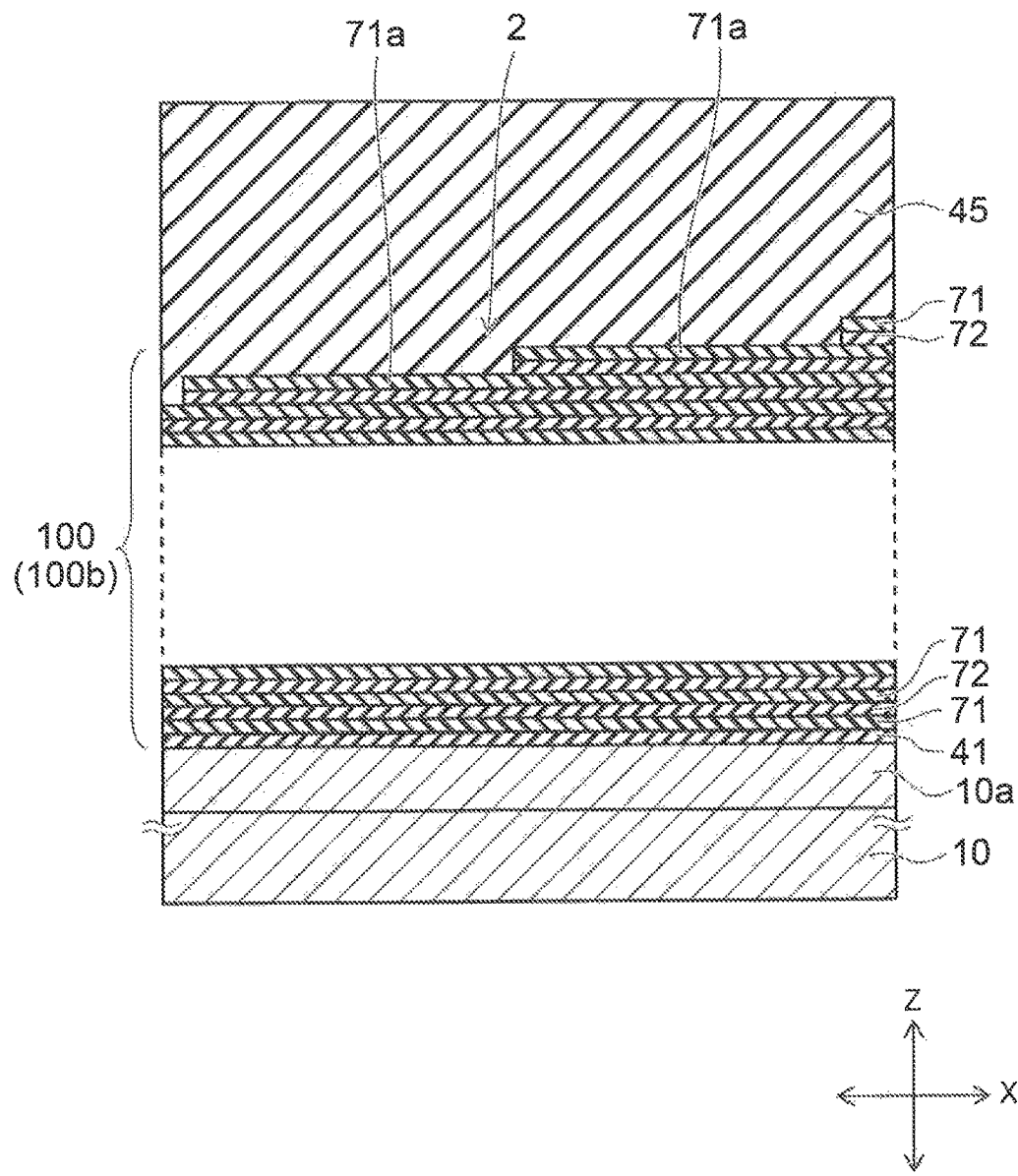

As shown in FIG. 20, the insulating layer 45 is formed on the stairstep portion 2. The insulating layer 45 fills the differences in levels of the stairstep portion 2; and the upper surface of the insulating layer 45 is planarized. The insulating layer 45 is a silicon oxide layer including silicon oxide as a major component.

Figure 21:
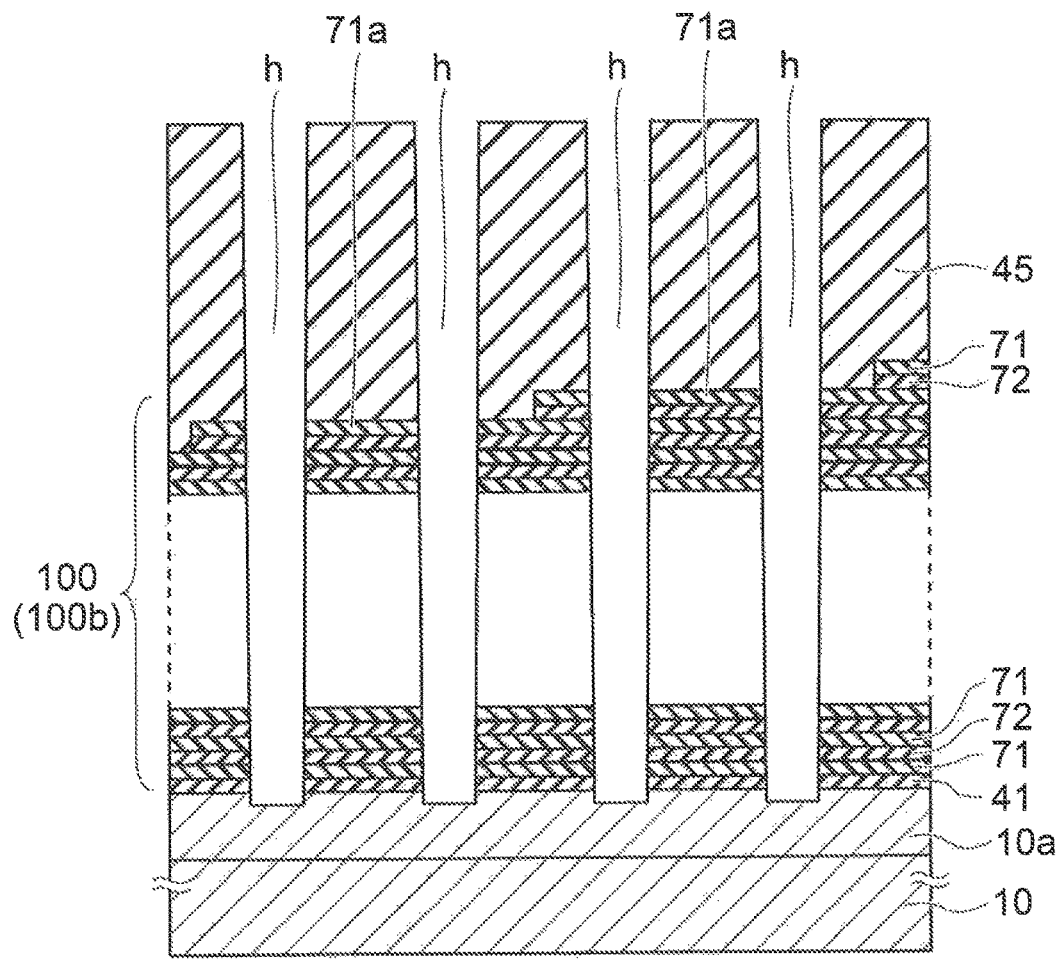

Then, as shown in FIG. 21, multiple holes h are formed in the insulating layer 45 and the second stacked portion 100b under the insulating layer 45. The holes h are formed simultaneously when forming the memory holes MH shown in FIG. 9. The memory holes MH and the holes h are formed simultaneously by RIE. The holes h extend in the Z-direction through the insulating layer 45 and through the second stacked portion 100b, and reach the active region 10a of the substrate 10.

Figure 22:
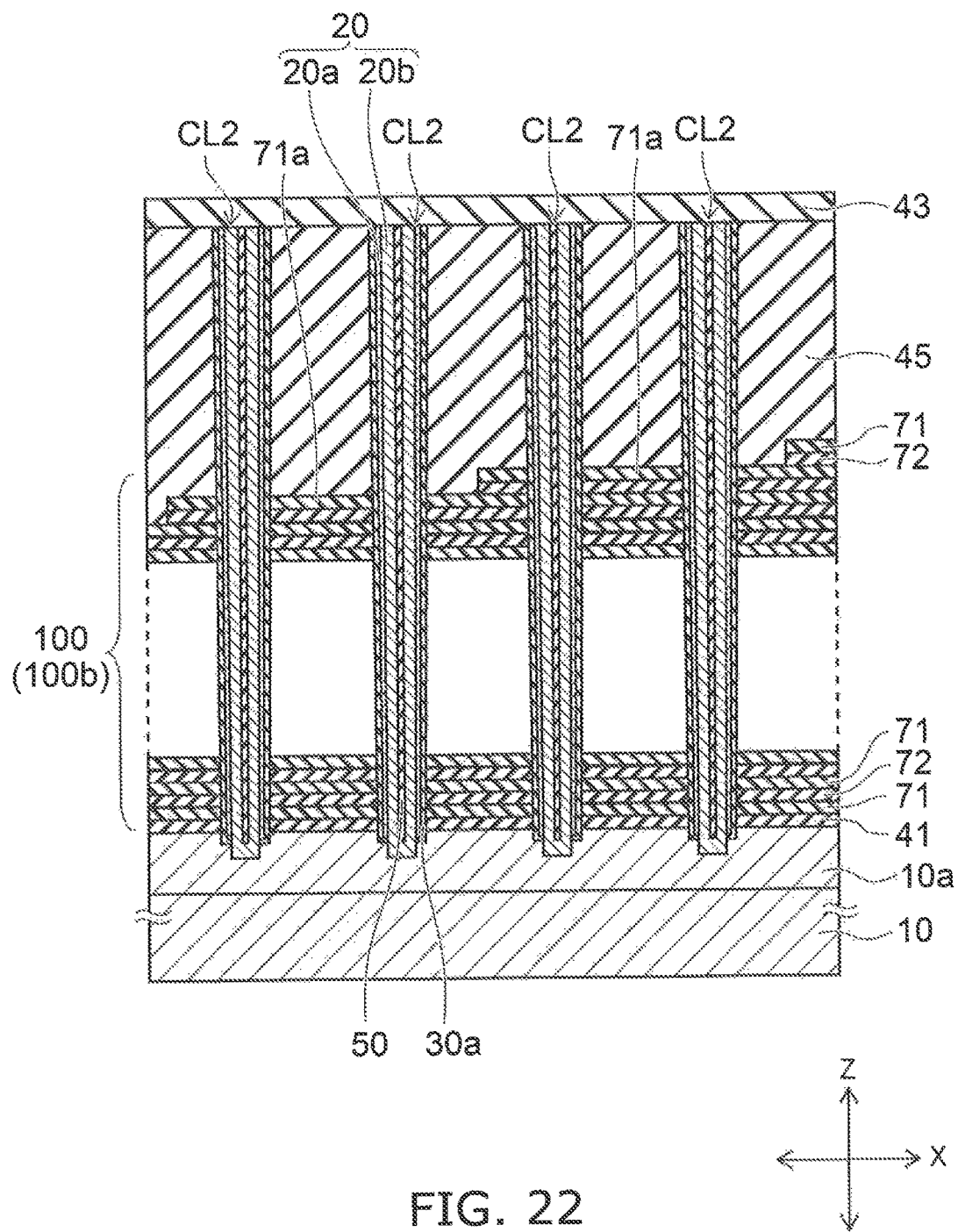

Columnar portions CL2 shown in FIG. 22 of the same film as the columnar portions CL1 inside the memory holes MH are formed also inside the holes h. The stacked film 30a, the semiconductor body 20, and the core film 50 each are formed also inside the holes h simultaneously when forming the stacked film 30a, the semiconductor body 20, and the core film 50 inside the memory holes MH.

As shown in FIG. 22, the insulating layer 43 is formed on the insulating layer 45; and the insulating layer 43 covers the upper ends of the columnar portions CL2.

Subsequently, the slits ST that extend in the X-direction as shown in FIG. 2 are formed in the first stacked portion 100a of the cell array region, the insulating layers 43 and 45 of the stairstep region, and the stacked body including the second stacked portion 100b.

Figure 23:
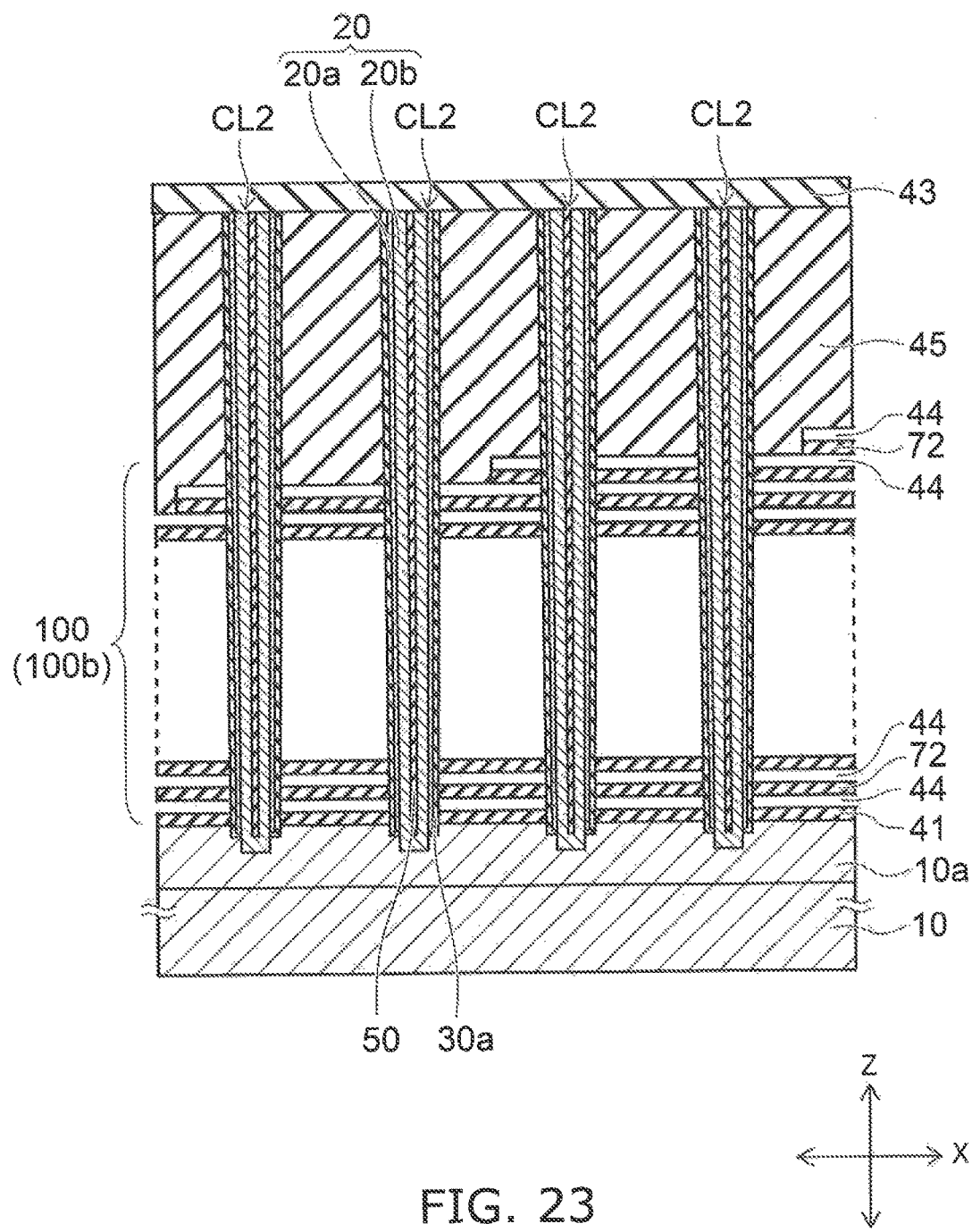

Then, the sacrificial layers 71 of the first stacked portion 100a and the second stacked portion 100b are removed using, for example, an etchant including phosphoric acid supplied through the slits ST. The sacrificial layers 71 are removed; and the gaps 44 shown in FIG. 23 are formed also in the second stacked portion 100b.

The outermost film of the stacked film 30a of the columnar portions CL1 and the columnar portions CL2 is the first blocking film 34. The first blocking film 34 is a silicon oxide film of a material that is different from the silicon nitride layer of the sacrificial layer 71 and has resistance to the etching conditions when removing the sacrificial layers 71. Accordingly, when removing the sacrificial layers 71, the columnar portions CL1 and the columnar portions CL2 remain without being etched.

The insulating layers 72 of the second stacked portion 100b contact the side surfaces of the columnar portions CL2 to surround the side surfaces of the columnar portions CL2. The insulating layers 72 are supported by such a physical bond with the columnar portions CL2; and the gaps 44 are maintained between the insulating layers 72.

Figure 24:
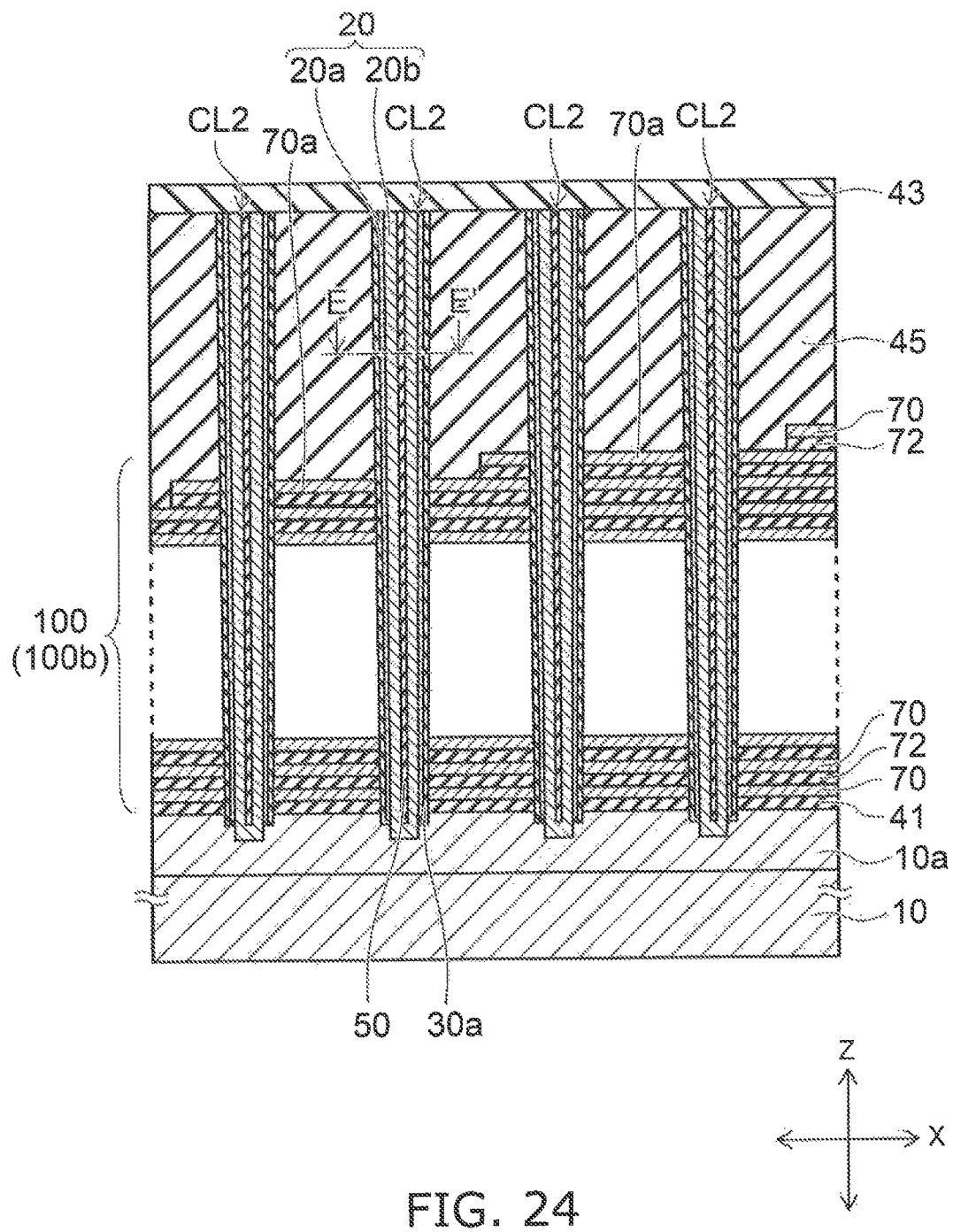

Then, as shown in FIG. 24, the electrode layers 70 are formed also in the gaps 44 of the second stacked portion 100b simultaneously when forming the electrode layers 70 in the gaps 44 of the first stacked portion 100a.

Also, similarly to the first stacked portion 100a, the second blocking films 35 shown in FIG. 5A are interposed between the electrode layers 70 and the columnar portions CL2, and between the electrode layers 70 and the insulating layers 72 of the second stacked portion 100b.

Subsequently, the interconnect portion LI is formed, with the insulating film 63 interposed, inside the slits ST.

Figure 25:
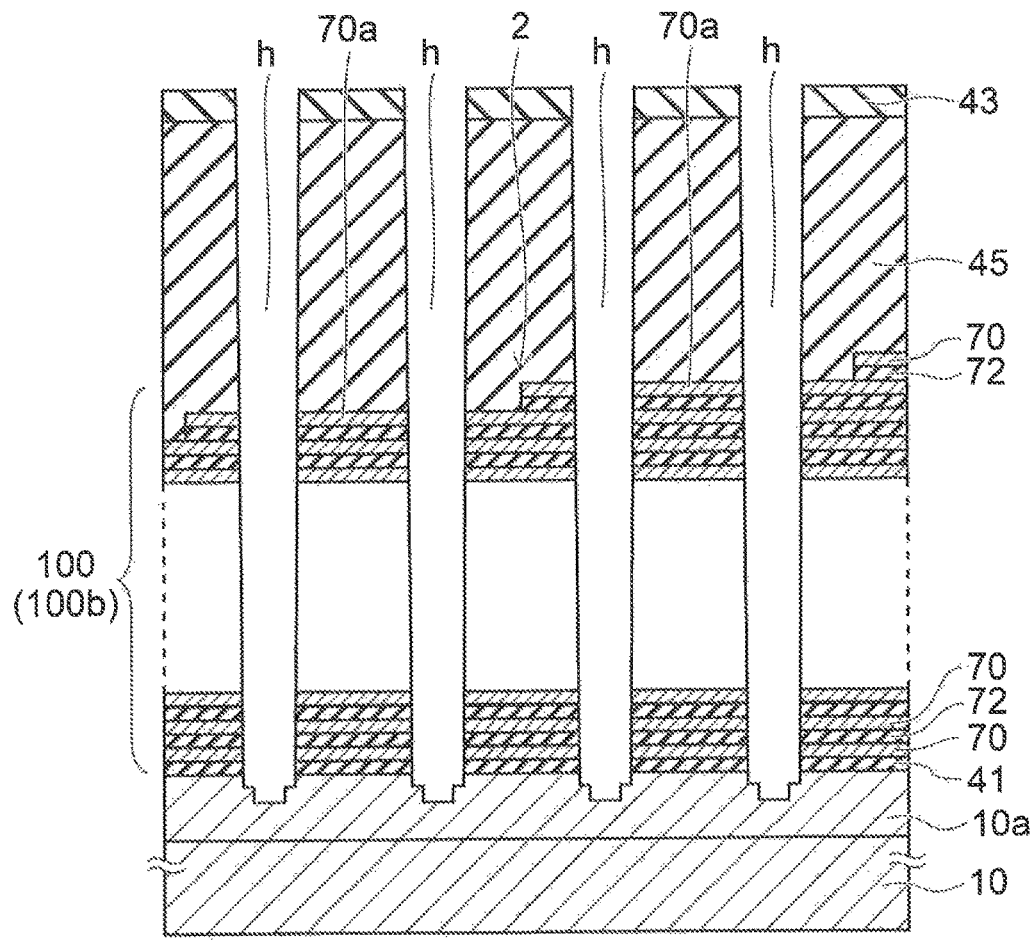

Subsequently, the columnar portions CL2 are removed. First, openings are formed selectively in the insulating layer 43; and the upper ends of the columnar portions CL2 are exposed. Then, the columnar portions CL2 are removed by causing etching of the columnar portions CL2 to progress from the exposed upper ends. The columnar portions CL2 are removed; and as shown in FIG. 25, the holes h formed inside the insulating layer 45 and inside the second stacked portion 100b occur.

When removing the columnar portions CL2, the cell array region is covered with, for example, a resist film.

Figure 26A:
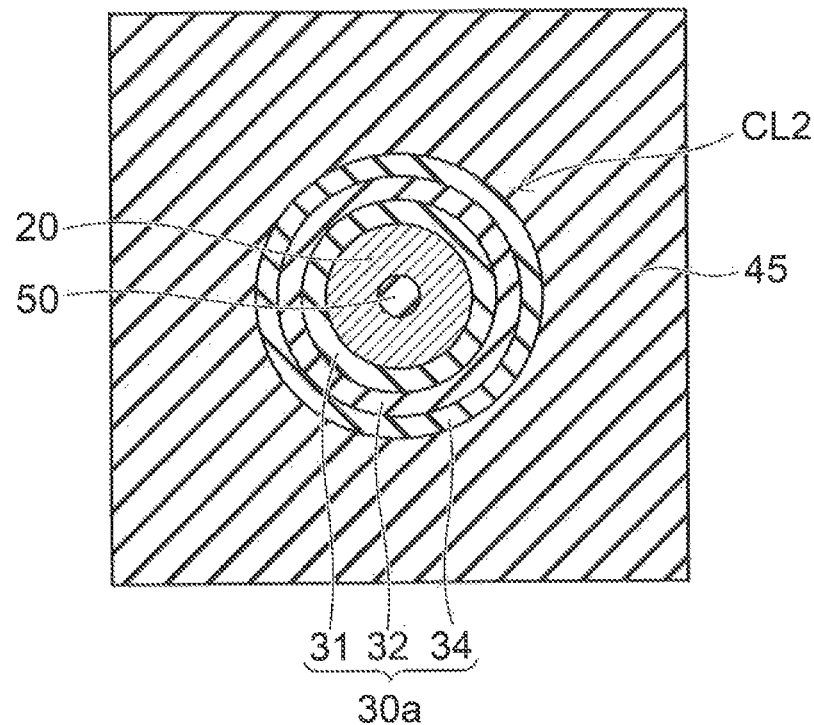
FIG. 26A is an E-E' cross-sectional view of FIG. 24.

FIG. 26A is an E-E' cross-sectional view of FIG. 24 prior to removing the columnar portions CL2.

Among the core film 50, the semiconductor body 20, the tunneling insulating film 31, the charge storage film 32, and the first blocking film 34 of the columnar portion CL2, for example, the semiconductor body 20 is initially removed.

The semiconductor body 20 is of a material that is different from the insulating layer 45; and the semiconductor body 20 can be etched at a high rate with respect to the insulating layer 45.

Figure 26B:
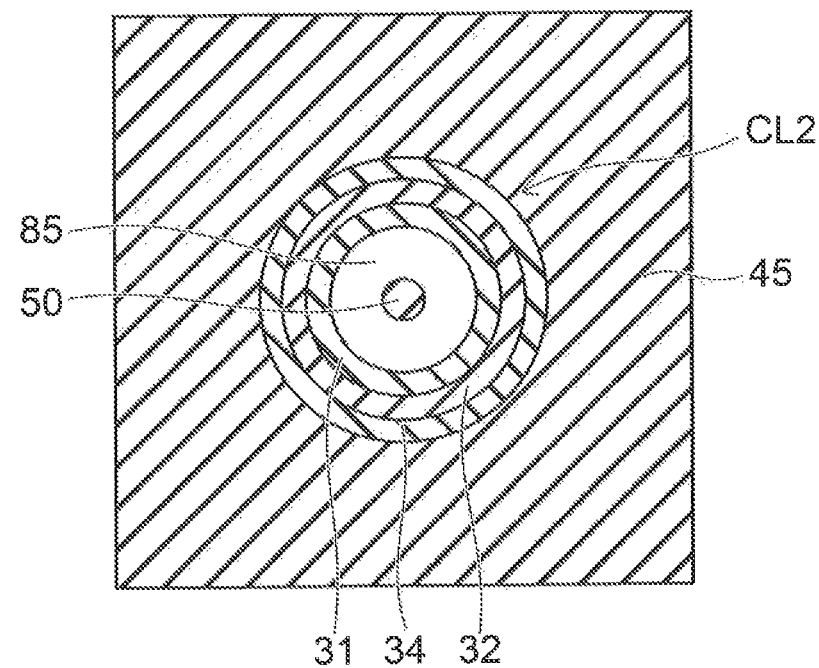
FIG. 26B is a cross-sectional view corresponding to FIG. 26A after removing a semiconductor body.

The semiconductor body 20 is removed; and as shown in FIG. 26B, a hollow 85 having a tubular configuration is formed between the core film 50 and the tunneling insulating film 31. It is acceptable for the core film 50 to collapse after the semiconductor body 20 is removed.

After removing the semiconductor body 20, the core film 50 and the tunneling insulating film 31 which are both silicon oxide films can be removed using, for example, an etchant including hydrofluoric acid. At this time, etching progresses also for the upper surface of the insulating layer 43 which is a silicon oxide layer. Further, the insulating layer 43 may be consumed; the upper surface of the insulating layer 45 which is a silicon oxide layer may be exposed; and etching of the upper surface of the insulating layer 45 may progress.

However, the etching of the core film 50 and the tunneling insulating film 31 progresses also from the side surface side exposed in the hollow 85. A substantially selective removal is possible for the core film 50 and the tunneling insulating film 31 which have extremely thin film thicknesses compared to the insulating layer 45. The core film 50 and the tunneling insulating film 31 can be removed while the insulating layer 45 that covers the stairstep portion 2 remains.

After removing the core film 50 and the tunneling insulating film 31, the charge storage film 32 which is, for example, a silicon nitride film is removed using an etchant including phosphoric acid.

The charge storage film 32 is removed; and a hollow is formed on the inner side of the first blocking film 34. Then, the first blocking film 34 which is a silicon oxide film is removed using, for example, an etchant including hydrofluoric acid. At this time as well, the etching of the first blocking film 34 progresses also from the side surface side of the first blocking film 34 exposed at the hollow on the inner side of the first blocking film 34; and a substantially selective removal is possible for the first blocking film 34 while the insulating layer 45 that covers the stairstep portion 2 remains.

For example, a silicon nitride film of a material that is different from the insulating layer 45 is filled into the holes h occurring when the columnar portions CL2 are removed; and the columnar portions CL3 shown in FIG. 6 are formed.

Figure 27:
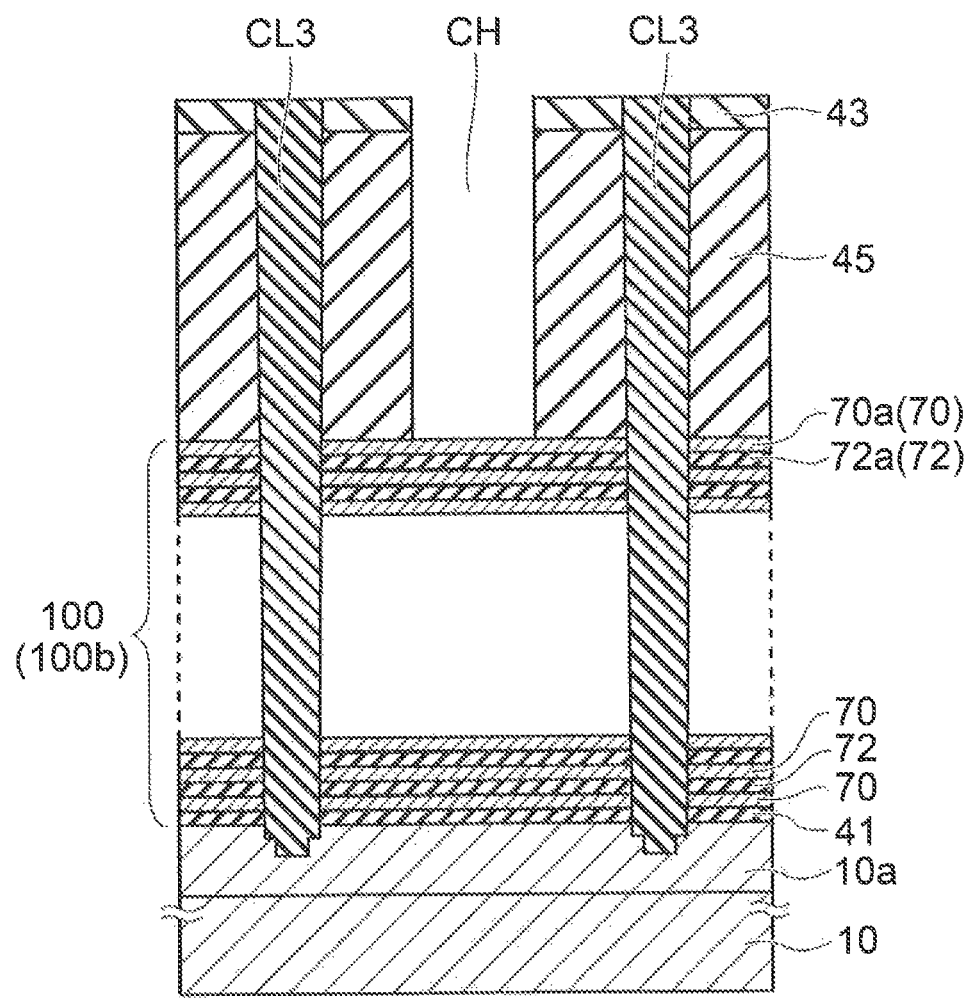
FIG. 27 is a schematic cross-sectional view showing a method for manufacturing the semiconductor device of the embodiment.

Subsequently, as shown in FIG. 27 corresponding to the C-C' cross section of FIG. 2, the contact holes CH are formed inside the insulating layer 45. The contact holes CH pierce the insulating layer 43 and the insulating layer 45, and reach the terrace portions 70a of the electrode layers 70. The contact holes CH are formed by etching the insulating layer 43 and the insulating layer 45 which are both silicon oxide layers by, for example, RIE.

A conductive material including a metal is filled into the contact holes CH; and the contact portions 91 shown in FIG. 7 are formed.

Even if the positions where the contact holes CH are formed undesirably overlap the columnar portions CL3, the etching of portions of the columnar portions CL3 that overlap the contact holes CH in the vertical direction can be suppressed because the columnar portions CO are formed of a material that is different from the insulating layer 45.

The formation of holes or spaces, that extend in the vertical direction and expose the electrode layers 70 of the second stacked portion 100b, at the outer circumferential of the columnar portions CL3 can be suppressed. This prevents the formation of a conductive material causing shorts between the multiple electrode layers 70. Further, shorts between the contact portions 91 and the electrode layers 70 not to be connected to the contact portions 91 also can be prevented.

Figure 28:
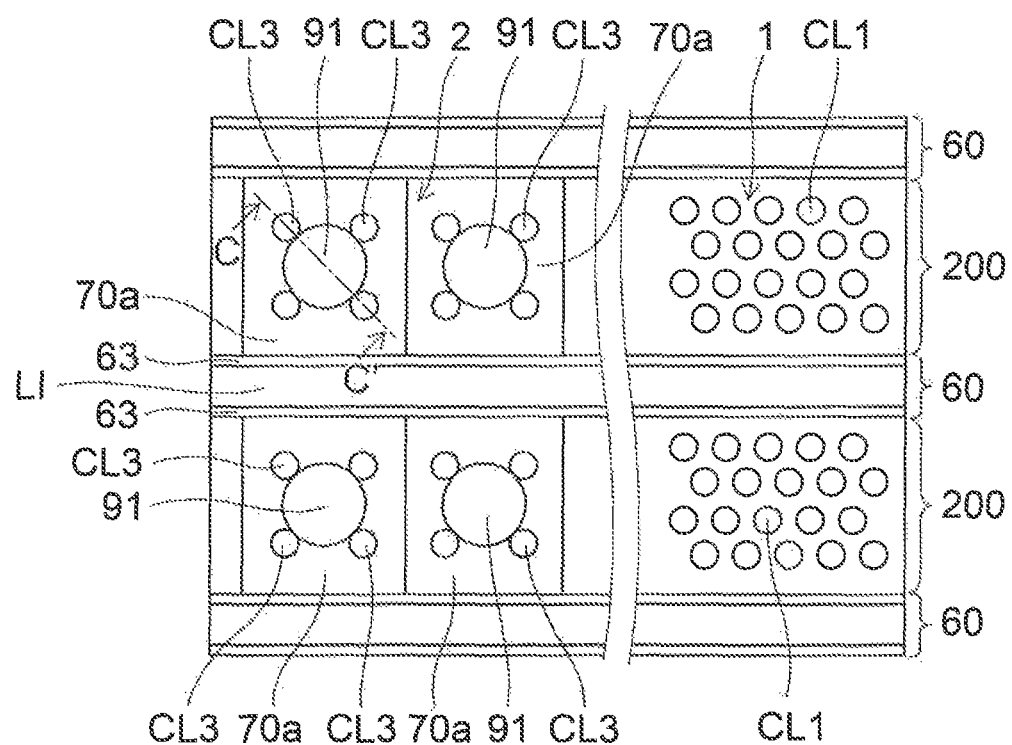
FIG. 28 is a schematic plan view of the semiconductor device of the embodiment
Figure 28:
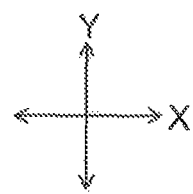

FIG. 28 is a schematic plan view corresponding to FIG. 2 and shows another example of the layout of the contact portions 91 and the columnar portions CL3.

Figure 29:
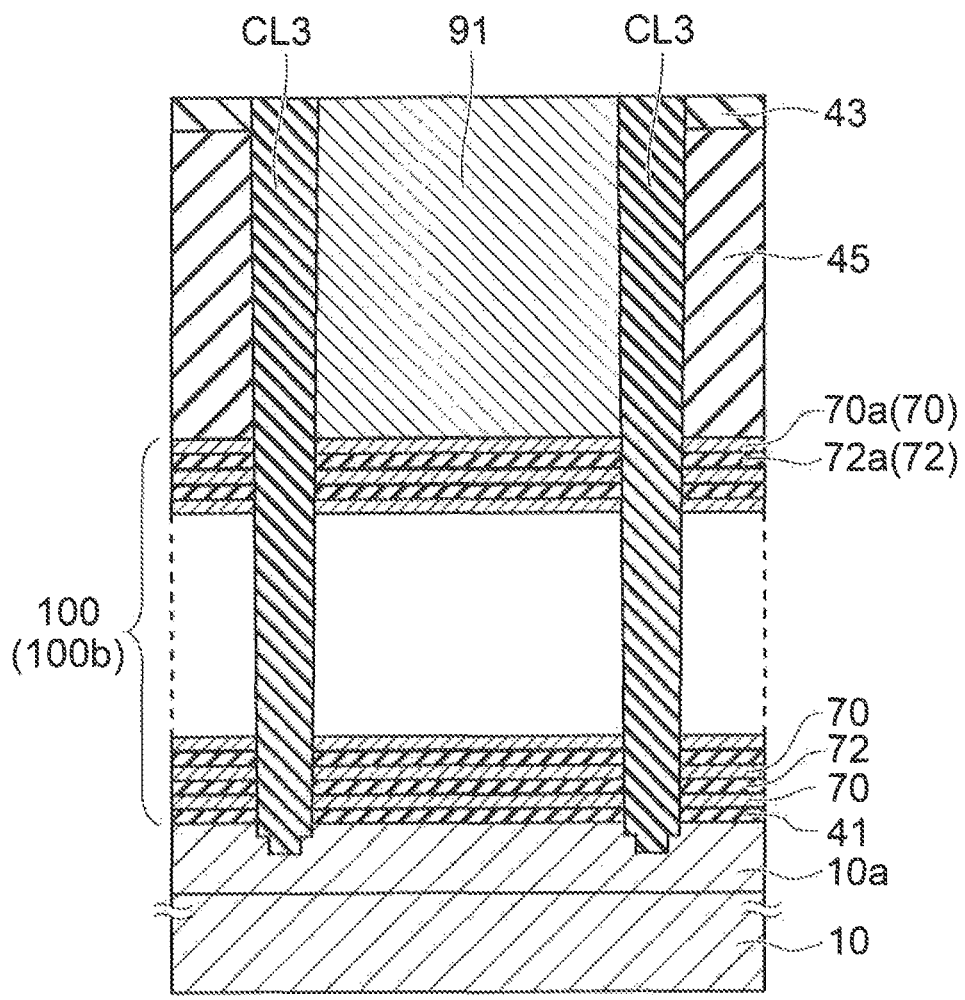
FIG. 29 is an C-C' cross-sectional view of FIG. 28.

FIG. 29 is a C-C' cross-sectional view of FIG. 28.

The side surface of the contact portion 91 contacts the side surfaces of the columnar portions CL3 disposed at the periphery of the contact portion 91. Compared to the example shown in FIG. 2 and FIG. 7, the diameter of the contact portion 91 has expanded to regions contacting the columnar portions CL3. Such a larger diameter of the contact portion 91 lowers the resistance of the contact portion 91 and realizes higher operation speeds of the potential control of the electrode layers 70.

Because the columnar portions CL3 are insulators, the contact portion 91 is not shorted via the columnar portions CL3 to the electrode layers 70 not to be connected.

Or, in the example shown in FIG. 2, by setting the columnar portions CL3 at the periphery of the contact portion 91 to approach positions contacting the contact portion 91, the surface area of one terrace portion 70a where the columnar portions CL3 are disposed can be reduced.

Figure 30:
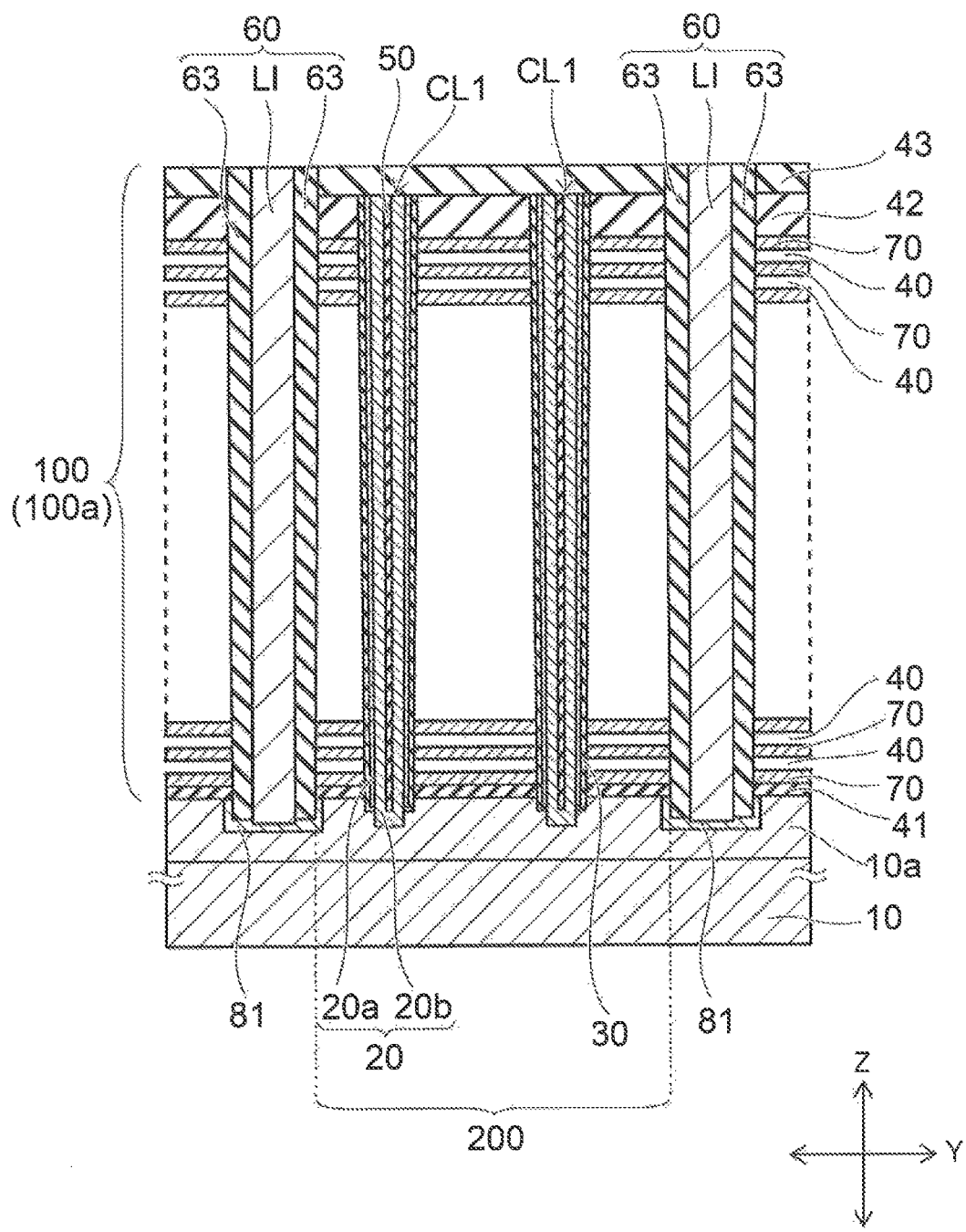
FIG. 30 is a schematic cross-sectional view of another example of the memory cell array of the embodiment.

FIG. 30 is a schematic cross-sectional view corresponding to FIG. 4 and shows another example of the first stacked portion 100a.

Figure 31:
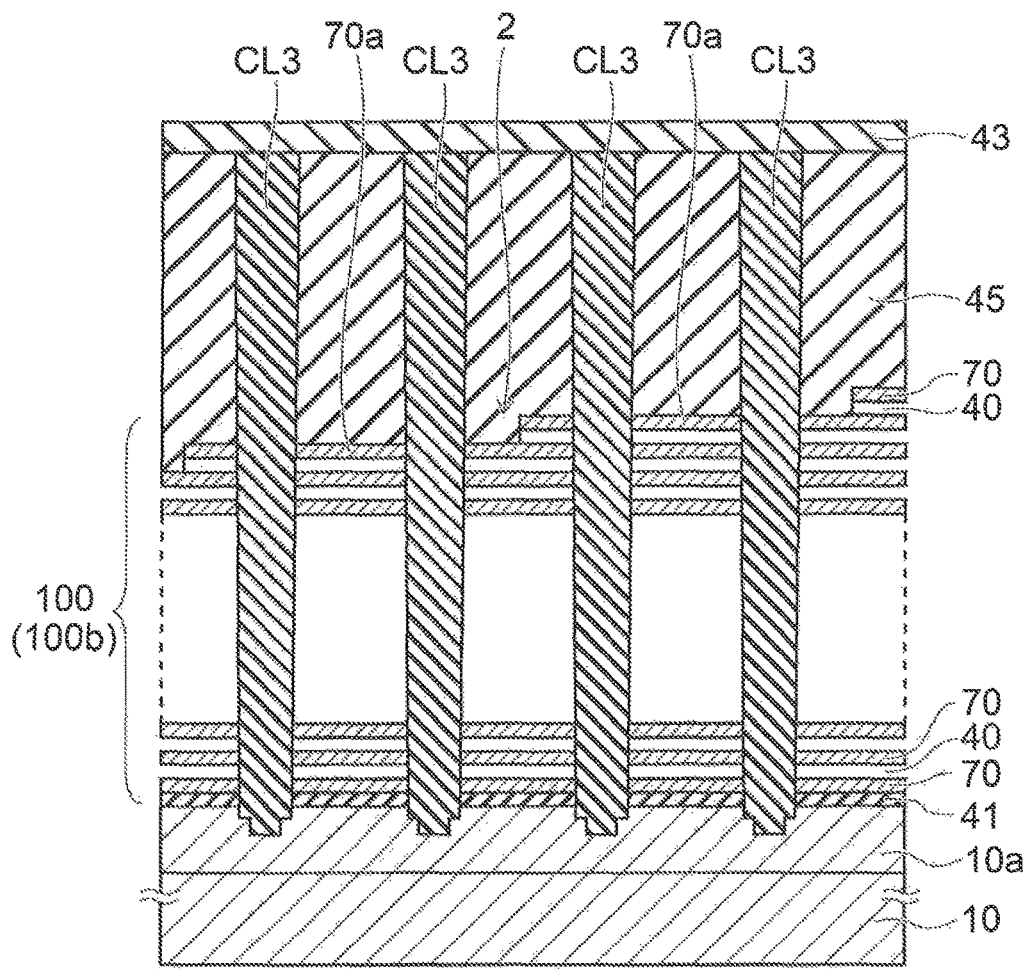
FIG. 31 is a schematic cross-sectional view of another example of a stairstep portion of the embodiment.

FIG. 31 is a schematic cross-sectional view corresponding to FIG. 6 and shows the other example of the second stacked portion 100b.

Figure 32:
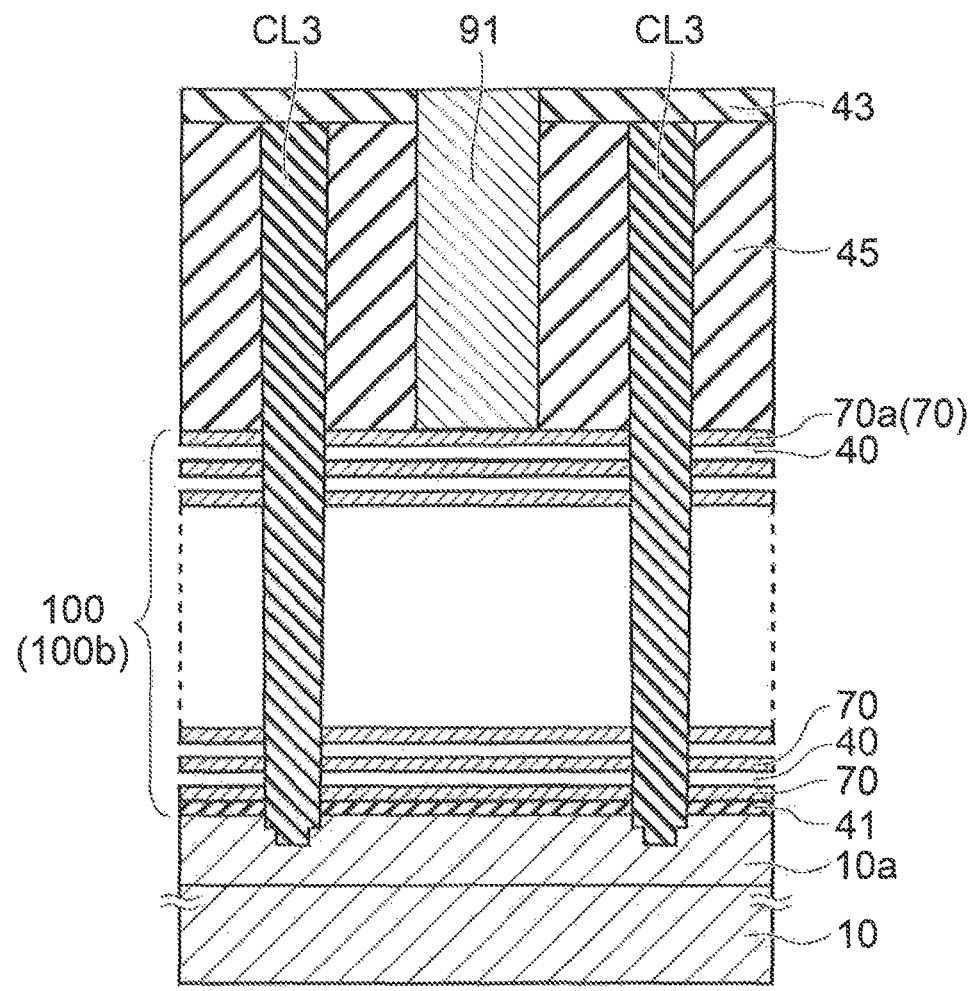
FIG. 32 is a schematic cross-sectional view of the other example of the stairstep portion of the embodiment.

FIG. 32 is a schematic cross-sectional view corresponding to FIG. 7 and shows the other example of the second stacked portion 100b.

According to the structures of FIG. 30 to FIG. 32, gaps 40 are provided as an insulator between the electrode layers 70.

The electrode layers 70 of the cell array region are supported by the physical bond with the columnar portions CL1; and the gaps 40 are maintained. The electrode layers 70 of the stairstep region are supported by the physical bond with the columnar portions CO; and the gaps 40 are maintained.

The gaps 40 are formed between the electrode layers 70 which are the control gates of the memory cells MC adjacent to each other in the stacking direction. The gaps (air gaps) 40 having lower dielectric constant than an insulating film such as a silicon oxide film, etc., reduce the interconnect capacitance between the electrode layers 70 above and below, and make high-speed operations of the memory cells MC possible. Further, interference between adjacent cells such as the threshold fluctuation due to capacitive coupling between the electrode layers 70 above and below, etc., can be suppressed.

A method for forming the structure of FIG. 30 to FIG. 32 will now be described with reference to FIG. 33 to FIG. 36.

Figure 33:
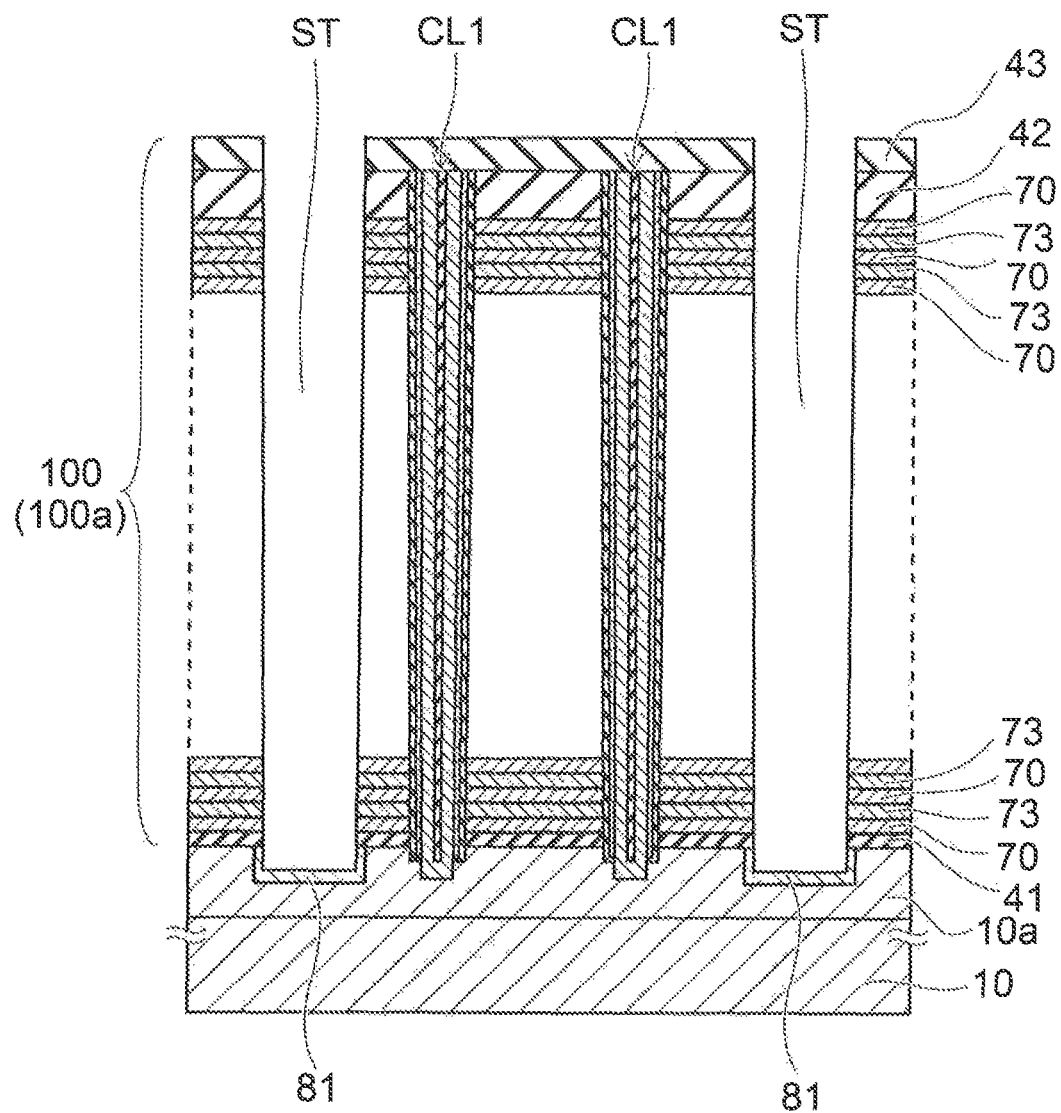
FIGS. 33 to 36 are schematic cross-sectional views showing a method for manufacturing the semiconductor device of the embodiment.
Figure 34:
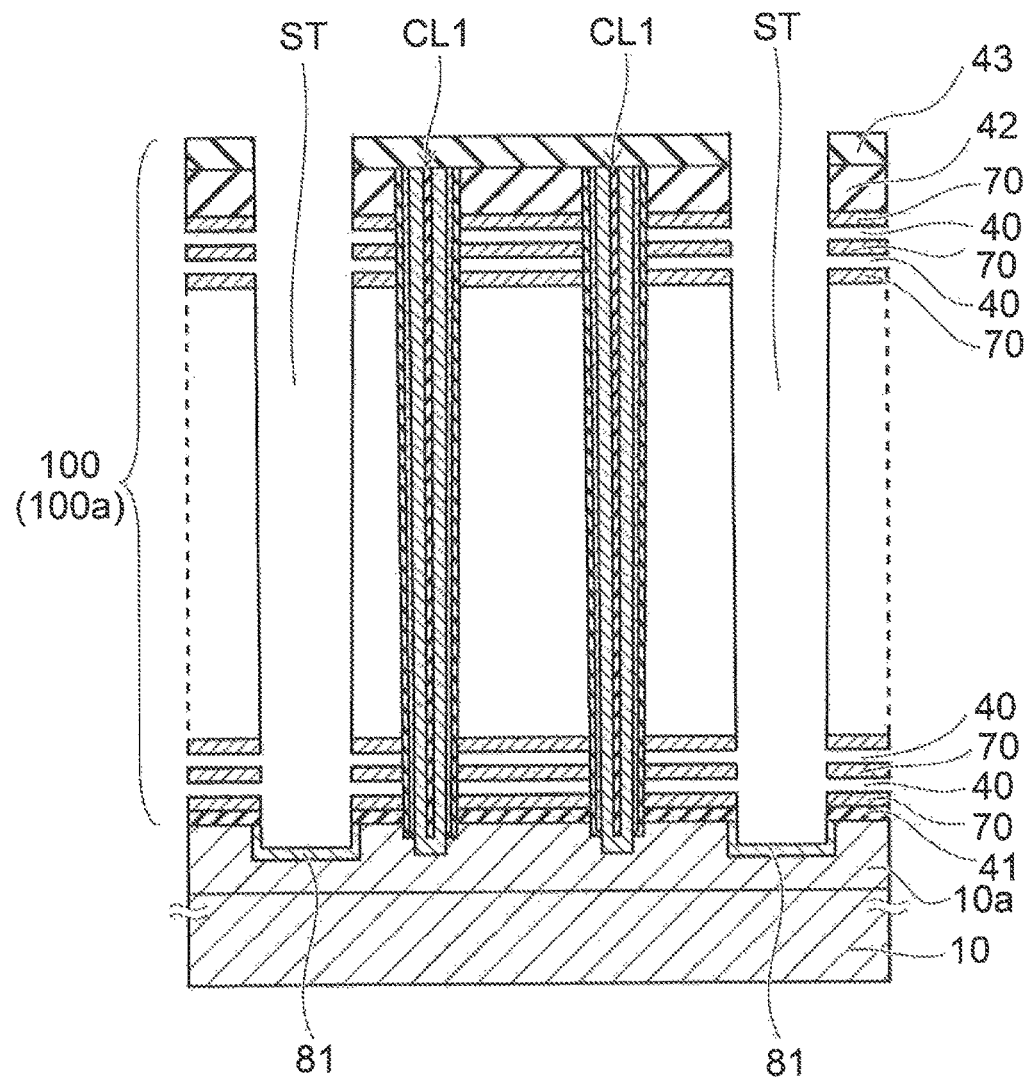

FIG. 33 and FIG. 34 are schematic cross-sectional views corresponding to FIG. 30.

Figure 35:
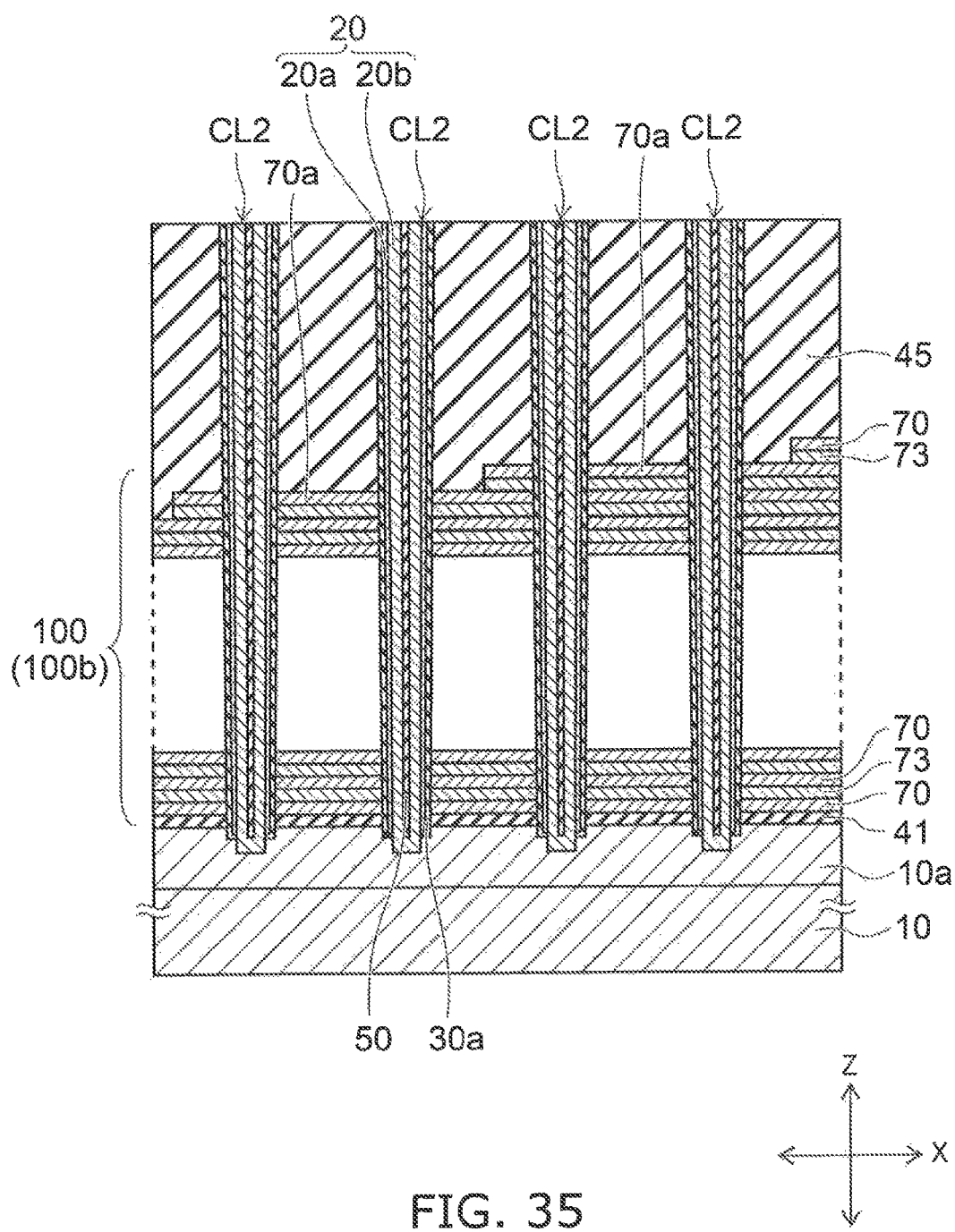
Figure 36:
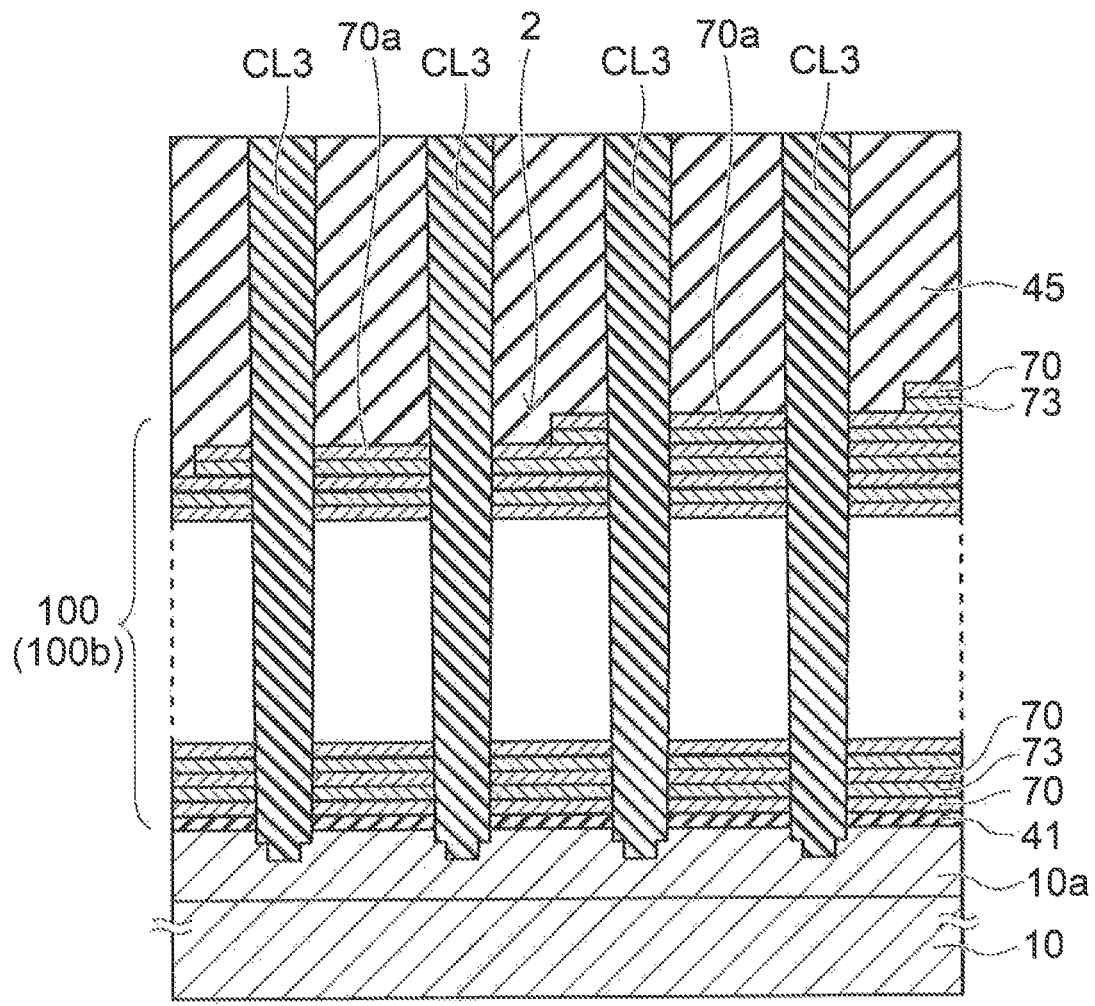

FIG. 35 and FIG. 36 are schematic cross-sectional views corresponding to FIG. 31.

As shown in FIG. 33, the stacked body 100 that includes the electrode layers 70 as the first layers and sacrificial layers 73 as the second layers is formed on the substrate 10. The electrode layers 70 are, for example, tungsten layers. The sacrificial layers 73 are metal layers of a material that is different from the electrode layers 70, e.g., molybdenum layers. Subsequently, as shown in FIG. 35, the second stacked portion 100b of the stairstep region is patterned into a stairstep configuration; and the terrace portions 70a are formed in the electrode layers 70. The insulating layer 45 is formed on the terrace portions 70a.

Subsequently, memory holes are formed in the first stacked portion 100a of the cell array region; and holes are formed in the second stacked portion 100b and the insulating layer 45 of the stairstep region. The memory holes and the holes are formed simultaneously by, for example, RIE.

Then, the columnar portions CL1 shown in FIG. 33 are formed inside the memory holes; and the columnar portions CL2 shown in FIG. 35 are formed inside the holes. The columnar portions CL1 and the columnar portions CL2 are formed simultaneously.

Subsequently, in a state in which the cell array region is covered with, for example, a resist film, the columnar portions CL2 of the stairstep region are removed and replaced with the columnar portions CL3 shown in FIG. 36. The columnar portions CL3 are pillars of, for example, silicon nitride that is different from the insulating layer 45.

Or, the columnar portions CL3 may be formed without forming the columnar portions CL2 inside the holes of the stairstep region. For example, in a state in which the cell array region including memory holes is covered with a resist film, the columnar portions CO are formed inside the holes of the stairstep region. Subsequently, the resist film of the cell array region is removed; and the columnar portions CL1 are formed inside the memory holes.

After forming the columnar portions CL1 and the columnar portions CL3, the insulating layer 43 is formed on the insulating layer 42 of the cell array region as shown in FIG. 34. As shown in FIG. 31, the insulating layer 43 is formed also on the insulating layer 45 of the stairstep region and covers the upper ends of the columnar portions CO.

Subsequently, the slits ST are formed in the cell array region and the stairstep region. Then, the sacrificial layers 73 are removed by etching through the slits ST. As shown in FIG. 34 and FIG. 31, the gaps 40 are formed between the electrode layers 70.

Subsequently, as shown in FIG. 30, the interconnect portion LI is formed, with the insulating film 63 interposed, inside the slits ST. Also, contact holes are formed in the insulating layer 45 on the terrace portions 70a; and the contact portions 91 shown in FIG. 32 are formed inside the contact holes. The side surfaces of the contact portions 91 may contact the side surfaces of the columnar portions CL3.

Figure 37:
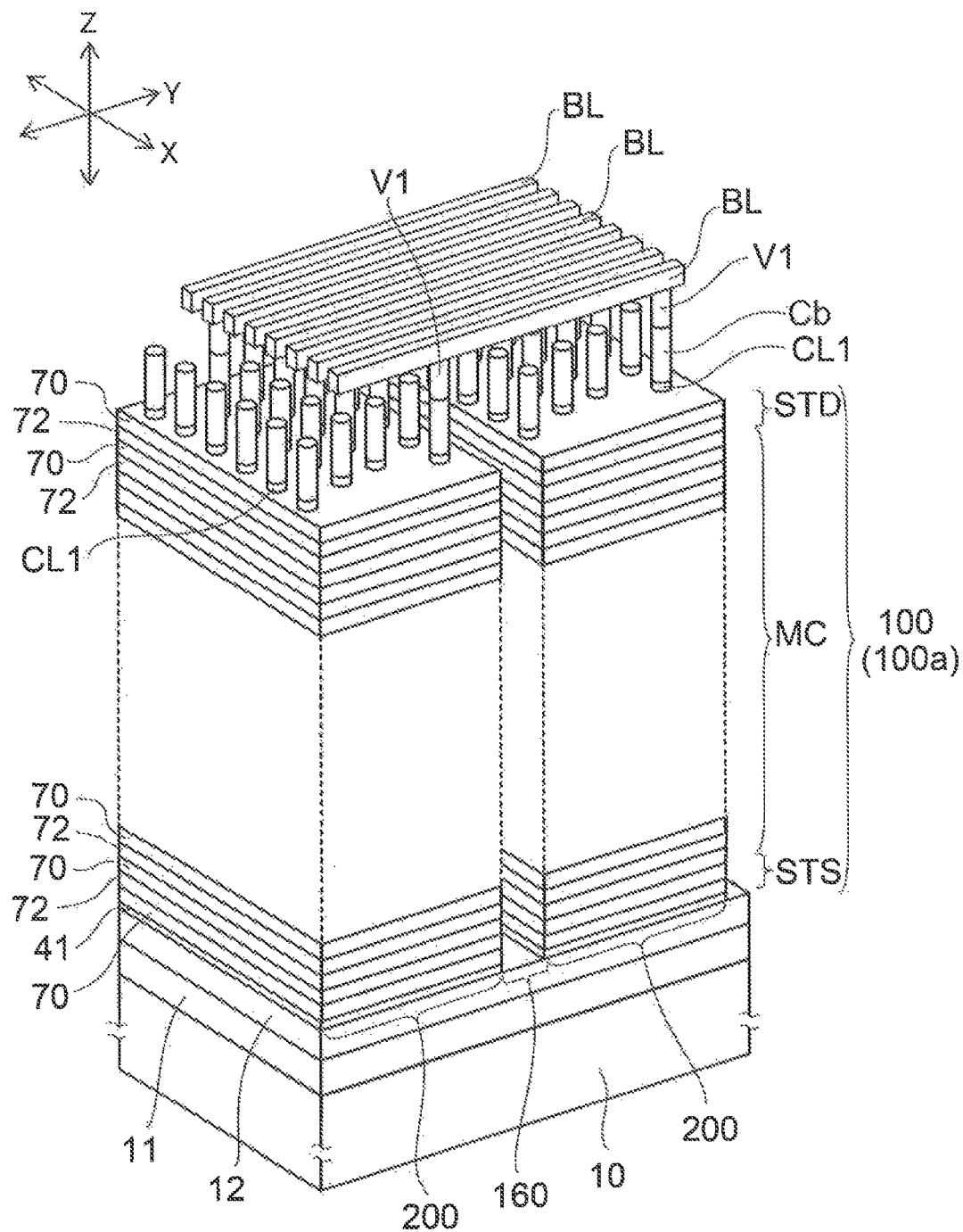
FIG. 37 is a schematic perspective view of another example of the memory cell array of the embodiment.

FIG. 37 is a schematic perspective view of another example of the memory cell array of the semiconductor device of the embodiment.

A first foundation layer 11 and a second foundation layer 12 are provided between the substrate 10 and the first stacked portion 100a. The first foundation layer 11 is provided between the substrate 10 and the second foundation layer 12; and the second foundation layer 12 is provided between the first foundation layer 11 and the first stacked portion 100a.

The second foundation layer 12 is a semiconductor layer or a conductive layer. Or, the second foundation layer 12 may include a stacked film of a semiconductor layer and a conductive layer. The first foundation layer 11 includes transistors and interconnects forming a control circuit.

The lower ends of the semiconductor bodies 20 of the columnar portions CIA contact the second foundation layer 12; and the second foundation layer 12 is connected to the control circuit. Accordingly, the lower ends of the semiconductor bodies 20 of the columnar portions CU are electrically connected to the control circuit via the second foundation layer 12. The second foundation layer 12 can be used as a source layer.

The first stacked portion 100a is divided into the multiple blocks 200 in the Y-direction by a separation portion 160. The separation portion 160 is an insulating film and does not include an interconnect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device, comprising:
a foundation layer;

a stacked body provided above the foundation layer, the stacked body including a plurality of electrode layers stacked with an insulator interposed, the plurality of electrode layers having a plurality of terrace portions arranged in a stairstep configuration with a difference in levels;

a semiconductor body extending through the stacked body in a stacking direction of the stacked body;

a charge storage portion provided between the semiconductor body and one of the electrode layers;

an insulating layer provided above the terrace portions;

a plurality of columnar portions extending in the stacking direction through the insulating layer and through the stacked body under the insulating layer, the columnar portions being of an insulating material different from the insulating layer; and a plurality of contact portions extending in the stacking direction through the insulating layer and being connected to the terrace portions, the contact portions including a first contact portion disposed inside a first terrace portion and a second contact portion disposed inside a second terrace portion, the columnar portions including a first columnar portion disposed inside the first terrace portion and a second columnar portion disposed inside the second terrace portion, a shortest distance between the first contact portion and the first columnar portion, and a shortest distance between the second contact portion and the second columnar portion being substantially equal to each other.

2. The semiconductor device according to claim 1, wherein the insulating layer includes silicon oxide as a major component, and the columnar portions include silicon nitride as a major component.

3. The semiconductor device according to claim 1, wherein diameters of the contact portions are larger than diameters of the columnar portions.

4. The semiconductor device according to claim 1, wherein a plurality of the semiconductor bodies is arranged more densely than the plurality of columnar portions.

5. The semiconductor device according to claim 1, wherein side surfaces of the columnar portions extending through the insulating layer are separated from the electrode layers.

6. A semiconductor device, comprising:

a foundation layer;

a stacked body provided above the foundation layer, the stacked body including a plurality of electrode layers stacked with an insulator interposed, the plurality of electrode layers having a plurality of terrace portions arranged in a stairstep configuration with a difference in levels;

a semiconductor body extending through the stacked body in a stacking direction of the stacked body;

a charge storage portion provided between the semiconductor body and one of the electrode layers;

an insulating layer provided above the terrace portions;

a plurality of columnar portions extending in the stacking direction through the insulating layer and through the stacked body under the insulating layer, the columnar portions being of an insulating material different from the insulating layer; and a contact portion extending in the stacking direction through the insulating layer, being connected to one of the terrace portions, and contacting a side surface of one of the columnar portions.

7. The semiconductor device according to claim 6, wherein the insulating layer includes silicon oxide as a major component, and the columnar portions include silicon nitride as a major component.

8. The semiconductor device according to claim 6, wherein a diameter of the contact portion is larger than diameters of the columnar portions.

9. The semiconductor device according to claim 6, wherein a plurality of the semiconductor bodies is arranged more densely than the plurality of columnar portions.

10. The semiconductor device according to claim 6, wherein side surfaces of the columnar portions extending through the insulating layer are separated from the electrode layers.

* * * * *